United States Patent
Kano et al.

(10) Patent No.: US 12,456,697 B2
(45) Date of Patent: Oct. 28, 2025

(54) MULTILAYER WIRING SUBSTRATE AND MODULE HAVING MULTILAYER WIRING SUBSTRATE

(71) Applicant: TOPPAN INC., Tokyo (JP)

(72) Inventors: Noriko Kano, Tokyo (JP); Tomoyuki Shirasaki, Tokyo (JP); Susumu Maniwa, Tokyo (JP)

(73) Assignee: TOPPAN INC., Tokyo (JP)

( * ) Notice: Subject to any disclaimer, the term of this patent is extended or adjusted under 35 U.S.C. 154(b) by 463 days.

(21) Appl. No.: 17/988,847

(22) Filed: Nov. 17, 2022

(65) Prior Publication Data

US 2023/0111374 A1     Apr. 13, 2023

Related U.S. Application Data

(63) Continuation of application No. PCT/JP2021/016277, filed on Apr. 22, 2021.

(30) Foreign Application Priority Data

Jun. 4, 2020 (JP) ................. 2020-097728

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4857* (2013.01); *H01L 23/49822* (2013.01);
(Continued)

(58) Field of Classification Search
None
See application file for complete search history.

(56) References Cited

U.S. PATENT DOCUMENTS

2003/0071300 A1      4/2003  Yashima et al.
2003/0139016 A1*     7/2003  Watanabe ............. H01G 4/06
                                                 438/393
(Continued)

FOREIGN PATENT DOCUMENTS

EP     1 170 797 A2    1/2002
JP     2000-076934 A   3/2000
(Continued)

OTHER PUBLICATIONS

JP 2004071589 A Translation (Year: 2025).*
(Continued)

*Primary Examiner* — Timothy J Thompson
*Assistant Examiner* — John B Freal
(74) *Attorney, Agent, or Firm* — Foley & Lardner LLP

(57) ABSTRACT

A multilayer wiring substrate and a module having the multilayer wiring substrate, wherein the multilayer wiring substrate has a capacitor with a capacitance value smaller than that of the conventional one. The substrate includes a core substrate and capacitors installed therein. At least one of the capacitors is a first capacitor which includes a lower electrode, a dielectric layer, and an upper electrode. The lower electrode is located closer to the core substrate than the dielectric layer and the upper electrode are. The upper electrode is located farther away from the core substrate than the dielectric layer and the lower electrode are. The lower electrode is entirely disposed on the core substrate. The upper electrode has a first portion and a second portion. The first portion overlaps the dielectric layer and the lower electrode to serve as the first capacitor. The second portion extends from the first portion.

8 Claims, 30 Drawing Sheets

(51) Int. Cl.
*H01L 23/498* (2006.01)
*H03H 3/00* (2006.01)
*H03H 7/01* (2006.01)
*H05K 1/16* (2006.01)

(52) U.S. Cl.
CPC ......... *H01L 23/49838* (2013.01); *H03H 3/00* (2013.01); *H03H 7/0115* (2013.01); *H05K 1/162* (2013.01); *H05K 1/165* (2013.01); *H01L 2223/6672* (2013.01)

(56) References Cited

U.S. PATENT DOCUMENTS

| | | | |
|---|---|---|---|
| 2014/0035935 A1* | 2/2014 | Shenoy | H01L 24/19 174/257 |
| 2014/0197902 A1 | 7/2014 | Zuo et al. | |
| 2017/0077079 A1 | 3/2017 | Lan et al. | |
| 2019/0131385 A1* | 5/2019 | Huang | H01G 4/224 |
| 2020/0275558 A1 | 8/2020 | Fujita | |

FOREIGN PATENT DOCUMENTS

| | | | |
|---|---|---|---|
| JP | 2002-329788 A | | 11/2002 |
| JP | 2004071589 A | * | 3/2004 |
| JP | 2010-103556 A | | 5/2010 |
| JP | 5982585 B2 | | 8/2016 |
| JP | 2018-534763 A | | 11/2018 |
| JP | 2019-106429 A | | 6/2019 |
| WO | WO-2019/117073 A1 | | 6/2019 |

OTHER PUBLICATIONS

International Searching Authority, "International Search Report," issued in connection with International Patent Application No. PCT/JP2021/016277, dated Jun. 29, 2021.
International Searching Authority, "Written Opinion," issued in connection with International Patent Application No. JP2021/016277, dated Jun. 29, 2021.
Office Action issued in corresponding Japanese Patent Application No. 2020-097728 dated Feb. 4, 2025.
European Extended Search Report issued in corresponding European Patent Application No. 21816796.3 dated Dec. 13, 2023 (9 pages).
Office Action issued in corresponding Japanese Patent Application No. 2020-097728 dated Sep. 10, 2024 (5 pages).

* cited by examiner

MULTILAYER WIRING SUBSTRATE AND MODULE HAVING MULTILAYER WIRING SUBSTRATE

CROSS-REFERENCE TO RELATED PATENT APPLICATIONS

This application is a continuation application filed under 35 U.S.C. § 111(a) claiming the benefit under 35 U.S.C. §§ 120 and 365 (c) of International Patent Application No. PCT/JP2021/016277, filed on Apr. 22, 2021, which in turn claims the benefit of JP 2020-097728, filed Jun. 4, 2020, the disclosures of all which are incorporated herein by reference in its entirety.

TECHNICAL FIELD

The present invention generally relates to a multilayer wiring substrate and a module having the multilayer wiring substrate.

BACKGROUND

In order to realize high-speed, high-capacity, ultra-low latency, and multiple simultaneous connections in mobile communications, the 5th generation communication standard, which expands the communication band from the conventional 750 MHz to 2.5 GHz to 3.5 to 6 GHz (Sub 6 GHz band), is spreading. At the same time, the performance, density, and miniaturization of electronic components used in mobile communication devices are also advancing.

Communication bands vary from country to country and from carrier to carrier, and the bands of mobile communication devices must be switched according to the situation. Between the antenna of the mobile communication device and a processor, there is an RF front-end circuit composed of components such as a frequency filter, a switching unit SW, or an amplifier, for switching the communication band. The frequency filter has a function of protecting a desired communication band from other communication bands or external noise. In the RF front-end circuits of high-end smartphones, the circuitry is optimized by packaging components such as frequency filters, switching units SWs, or amplifiers for each band to make an RF front-end module.

Carrier Aggregation (CA) technology, which uses multiple communication bands simultaneously for high-speed, high-capacity data communications, is also being increasingly adopted. In CA, mutual interference of simultaneously used frequency band signals must be avoided, making filtering of communication waves a more serious problem. Accordingly, optimization of modularization of RF front-end circuits for each CA is being considered.

There are two types of mobile communication systems: FDD (Frequency Division Duplex), in which a set of adjacent frequency bands are allocated for transmission and reception, and TDD (Time Division Duplex), in which a single frequency band is divided and allocated for transmission and reception. Compared to FDD, TDD is a superior technology in that the utilization efficiency of the frequency band is high even when the amount of data is different between transmission and reception, but the synchronization technology is more difficult. Since lower frequencies are better at transmitting radio waves, FDD with frequencies of 750 MHz and higher has become popular as a communication method, followed by TDD with frequencies of 1800 MHz and higher.

Since FDD transmits and receives in a set of frequency bands separated by a band of 10 to 30 MHz with a GAP of 10 to 30 MHz between bands, an Acoustic Wave type filter is suitable for the frequency filter, which has a narrow passband and steep attenuation characteristics to achieve a suppressed bandwidth. A Surface Acoustic Wave (SAW) filter is used in the band of up to 1.5 GHz and a Bulk Acoustic Wave (BAW) filter is used in the band of up to 3.5 GHz. Both BAW and SAW can be realized as small and thin components and are suitable for electronic components such as smartphones.

In the 5th generation communication standard, synchronization technology has further advanced, and a wideband TDD system with a band of 500 MHz to 900 MHz in the band of up to 6 GHz has been adopted, which is difficult for AW filters to handle. Such frequency filter requirements can be realized by LC filters that utilize electrical resonance using inductors and capacitors. The mild attenuation characteristics of the LC filter makes it difficult to achieve the conventional frequency filter requirement with a narrow GAP between communication bands. However, the 5th generation communication standard can be used because it has a wide GAP between communication bands.

When high-speed and high-capacity communication is realized by a plurality of frequency bands, the number of components such as a frequency filter, a switching unit SW, and an amplifier mounted on the RF front end module increases, and thus the module size also increases. The frequency filter being required for each communication band is one of the components having a large mounting area, which is a factor increasing the module size.

In the past, technologies have been proposed to reduce the number of components that occupy the surface of the substrate and make it smaller and thinner by incorporating passive components such as inductors and capacitors within the wiring substrate. Built-in components have an advantage in electrical characteristics because they can reduce parasitic components by shortening the length of the conductive wire and reduce reflections at the junction point with a different type of member such as solder. As a technique of a multilayer wiring substrate incorporating conventional components, there are a method of burying a capacitor or an inductor in the substrate, and a method of laminating and forming a capacitor or an inductor in the substrate by utilizing a lamination structure of a conductive layer and an insulating resin.

The multilayer wiring substrate using glass as a core material has features such as the formation of fine wiring due to the flatness and smoothness of glass and good electrical insulation properties. PTL 1 discloses a technique of forming an LC filter by forming a capacitor on the surface of a glass substrate and a part of an inductor in the glass substrate, and realizing a diplexer that performs wave splitting at 1.4 GHz. PTL 2 discloses details of a capacitor structure formed on a glass substrate.

Specifically, by using a multilayer laminated wiring substrate having an LC filter installed in the glass core substrate as the substrate of the module, components such as switching units SWs and amplifiers can be mounted on the frequency filter, and thus the RF front-end module can be downsized.

[Citation List] [Patent Literature] PTL 1: JP 5982585 B; PTL 2: JP 2018-534763 A.

SUMMARY OF THE INVENTION

Technical Problem

PTL 1 discloses an equivalent circuit of a diplexer in FIG. 4A, and discloses a structure of a capacitor C21 in the equivalent circuit in FIG. 4B. However, in PTL1, the capacitance value of C21 is realized by series connection of four capacitors. In the conventional capacitor structure disclosed in PTL 2, it is structurally difficult to reduce the area of the electrode, and thus the capacitance value must be reduced by connecting the capacitors in series.

In general, the capacitance value of the capacitor used for the LC filter of the frequency filter is reduced as the frequency increases. PTL 1 discloses an example of a diplexer that performs wave splitting at 1.4 GHz, but in the case of a Sub 6 GHz band LC filter, in the conventional capacitor structure, the required capacitance value must be realized by series connection of more capacitors. However, it is not preferable to realize the desired capacitance value with a plurality of elements, because it causes problems such as deterioration of characteristics due to wiring resistance and parasitic capacitance in the connections between elements, variation in capacitance value due to superposition of processing variation, and increase in mounting area.

The present invention has been made in view of these issues, and is directed to provide a multilayer wiring substrate and a module having the multilayer wiring substrate, wherein the multilayer wiring substrate has a capacitor with a capacitance value smaller than that of the conventional one, and is configured in the circuit board with high precision using a single element, and is improved or even excellent in performance, mountability and productivity.

Solution to Problem

To solve the above-described problems, one of the typical multilayer wiring substrates of the present invention includes: a core substrate, and capacitors installed therein. At least one of the capacitors is a first capacitor which includes a lower electrode, a dielectric layer, and an upper electrode. The lower electrode is located closer to the core substrate than the dielectric layer and the upper electrode are. The upper electrode is located farther away from the core substrate than the dielectric layer and the lower electrode are. The lower electrode is entirely disposed on the core substrate. The upper electrode has a first portion and a second portion. The first portion overlaps the dielectric layer and the lower electrode to serve as the first capacitor. The second portion extends from the first portion. The second portion is disposed on a surface of the core substrate on which the lower electrode is arranged. The second portion of the upper electrode includes a terminal.

Advantageous Effects of the Invention

The present invention can provide a multilayer wiring substrate and a module having the multilayer wiring substrate, wherein the multilayer wiring substrate has a capacitor with a capacitance value smaller than that of the conventional one, and is configured in the circuit board with high precision using a single element, and is improved or even excellent in performance, mountability and productivity.

Problems, configurations, and advantageous effects which are other than noted above will become apparent from the following description of embodiments.

BRIEF DESCRIPTION OF THE DRAWINGS

FIG. 2AA is a cross-sectional view showing a process for producing a multilayer wiring substrate according to the first embodiment of the present invention.

FIG. 2AB is a cross-sectional view showing a process for producing a multilayer wiring substrate according to the first embodiment of the present invention.

FIG. 2AC is a cross-sectional view showing a process for producing a multilayer wiring substrate according to the first embodiment of the present invention.

FIG. 2AD is a cross-sectional view showing a process for producing a multilayer wiring substrate according to the first embodiment of the present invention.

FIG. 2AE is a cross-sectional view showing a process for producing a multilayer wiring substrate according to the first embodiment of the present invention.

FIG. 2AF is a cross-sectional view showing a process for producing a multilayer wiring substrate according to the first embodiment of the present invention.

DETAILED DESCRIPTION

Figure 1:
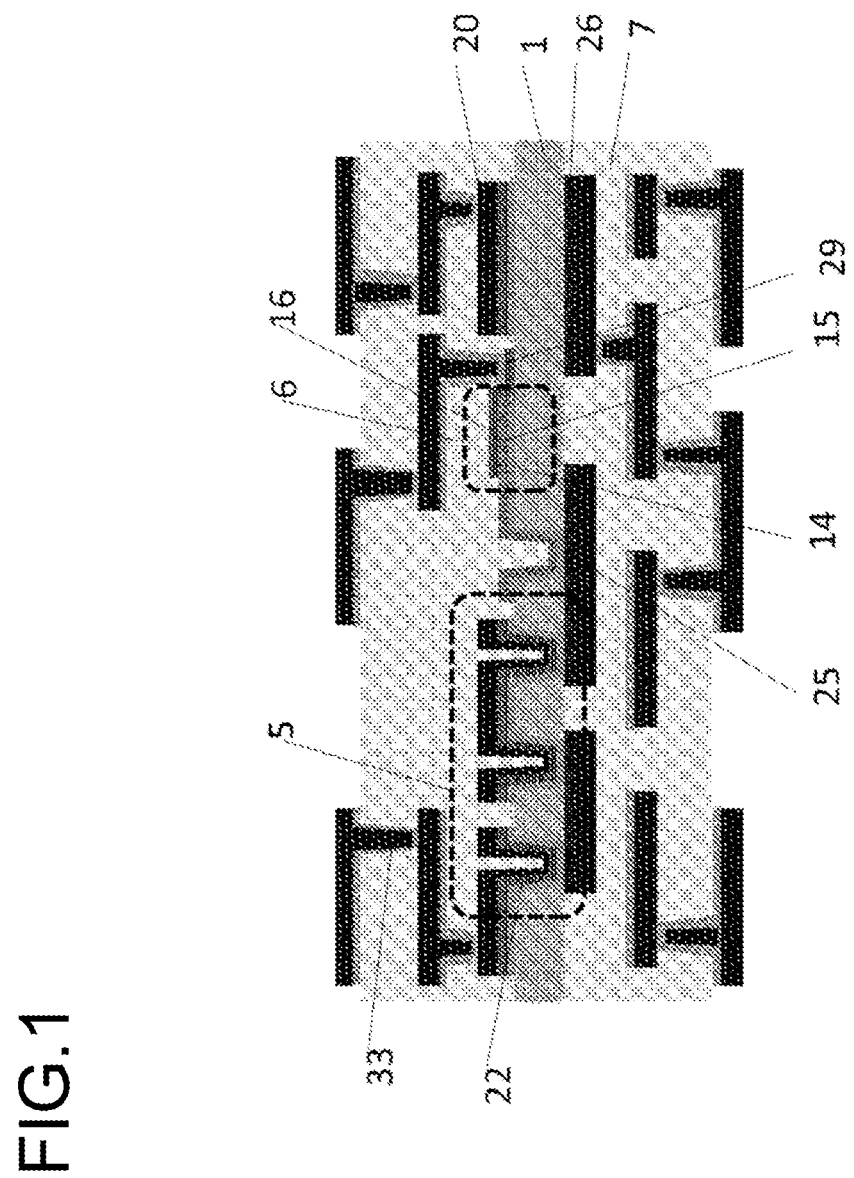
FIG. 1 is a cross-sectional view of a glass core multilayer wiring substrate incorporating a high-frequency LC filter according to a first embodiment of the present invention.

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

In the present disclosure, the term "above" refers to a direction receding from the glass core, whereas the term "below" refers to a direction approaching the glass core. An insulator used between the upper electrode and the lower electrode of the capacitor is referred to as a "dielectric".

First Embodiment

A first embodiment of the present invention will now be described with reference to the drawings. The present invention is not limited to the first embodiment. In the description of the drawings, the same components are given the same reference signs.

A multilayer wiring substrate according to the first embodiment has through holes 2 in a core substrate 1 and a thin-film capacitor structure 6 on the laminated surface. The capacitor structure serves as an electronic component which forms an LC resonance circuit or a capacitive passive component used in wireless communication such as mobile devices.

In FIG. 1, the multilayer wiring substrate includes a glass substrate as a core substrate 1.

The through holes 2 are formed in the core substrate 1 in the lamination direction of the multilayer wiring substrate. When the upper surface is the first surface and the lower surface is the second surface with respect to the cross section of the core substrate 1, conductive layers and insulating resin layers are alternately laminated on the first surface and the second surface, respectively. A through electrode 22 is formed in the core substrate 1 as a part that electrically connects adjacent conductor layers. An interlayer via 8 is formed in an insulating resin layer 7.

In the first embodiment, an inductor 5 is equivalent to coils each of which is wound and extends through one of the electrodes 22 in a thickness of the core substrate 1 and connects one of the conductive wire on the first surface of the core substrate 1 and one of the conductive wire on the second surface of the core substrate 1 together. The structure and the production process are shown. First, a schematic diagram of the inductor 5 is shown in FIG. 3.

Figure 3:
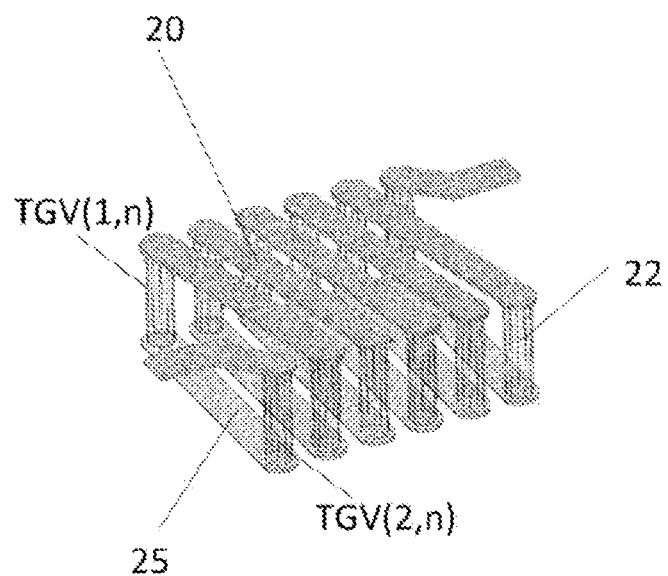
FIG. 3 is a three-dimensional perspective view showing a structure of an inductor according to the first embodiment of the present invention.

In FIG. 3, a parallel-plate shaped flat glass plate having through holes arranged in two rows is shown in a transparent state. As shown in FIG. 3, conductive wires 20 and 25 are disposed on the front and rear surfaces of the glass plate to connect the openings of the adjacent through holes, and a conductor layer, which is referred to as a through conductive via (hereinafter, TGV) 22, is formed on an inner wall of a through hole 2 that penetrates the glass plate between the front and rear surfaces.

The n-th TGV in the first row is referred to as TGV (1, n), and the n-th TGV in the second row is referred to as TGV (2, n). The TGV (1, n) and the TGV (2, n) are connected by the conductive wire 25 on the rear surface of the glass plate, whereas the TGV (1, n) and the TGV (2, n+1) are connected by the conductive wire 20 on the front surface of the glass plate. Thus, the conductive wire 25, the TGV (1, n), the conductive wire 20, and the TGV (1, n+1) form an open circuit of the conductor having one turn around the outer and inner surfaces of the glass plate. When supplied with a current, the circuit functions as an inductor. The characteristics of the inductor can be adjusted by, for example, changing the number of turns.

Next, a high-frequency LC filter built in the glass core multilayer wiring substrate according to the first embodiment will be described in detail. An LC filter uses the resonance phenomenon of an inductor and a capacitor to pass an electrical signal to a circuit at a specific frequency, and to block an electrical signal at other frequencies. The electrical signal of the frequency to be passed is not a single point, but has some specified range. Actions of passing or blocking the electrical signal is not achieved using a switch in an on or off operation, but rather the transmittance changes with a finite gradient, and the gradient usually depends upon the performance of the LC filter.

Therefore, there are many inductors and capacitors that make up the LC filter, and not just a single pair, and they are designed as a whole to meet detailed requirements for transmission and interruption.

Figure 4:
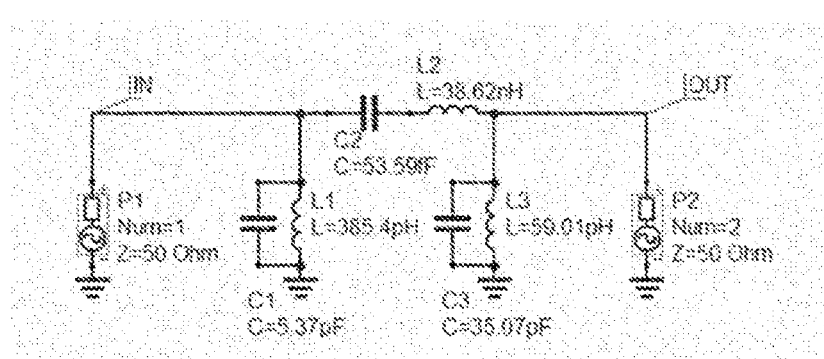
FIG. 4 is a circuit diagram of an LC filter according to the first embodiment of the present invention.

For example, a circuit diagram of an LC filter intended for a transmission frequency band of 3.3 GHz to 3.7 GHz is shown in FIG. 4, and C1 to C3 are capacitors and L1 to L3 are inductors. The respective capacitance and inductance values are shown in Tables 1 and 2.

TABLE 1

|  | C1 | C2 | C3 |
|---|---|---|---|
| Capacitance | 5.37 pF | 53.59 fF | 35.07 pF |
| Dielectric | SiN | SiN | SiN |
| Relative permittivity | 6.3 | 6.3 | 6.3 |
| Dielectric thickness | 200 nm | 200 nm | 200 nm |
| Length of one side | 138.7 μm | 13.9 μm | 354.5 μm |

TABLE 2

|  | L1 | L2 | L3 |
|---|---|---|---|
| Inductance | 385.4 pF | 38.62 nH | 59.01 pH |
| Number of turns |  | 11 |  |
| Coil width |  | 1.6 mm |  |
| Coil length |  | 1.5 mm |  |
| Coil thickness |  | 0.3 mm |  |
| Conductive wire length | 1.33 mm |  | 0.2 mm |
| Conductive wire width | 0.1 mm |  | 0.1 mm |
| Conductive wire thickness | 15 μm |  | 15 μm |

In Table 2 which shows inductances, there are some blank cells indicating number of turns. The blank cells indicate that they have a very low inductance, and thus in the ordinary process, even a single turn would be excessive, and the desired inductance must be achieved by the self-inductance of a conductive wire.

Similarly, among the capacitances in Table 1, one side of the capacitor electrode to realize C2 is 13.9 μm because the required capacitance is so small. In the case of such a small electrode, the electrode is directly connected to the electrode via and cannot be connected to other components, and the electrode is connected to a terminal outside the capacitor by a fine wiring, and the terminal is made large enough to be connected to the electrode via. In this case, since the conductive wire can be shortened compared to the case where a plurality of elements are used to achieve the desired capacitance value, the parasitic inductance of the conductive wire can be reduced, and the influence on the LC filter can be suppressed. This is one of the advantages of the present embodiment.

Although a plurality of capacitors and inductors are required in the contents of the circuit diagram, in the explanatory diagram of the first embodiment, a substrate including one inductor and one capacitor is used in a simplified manner to avoid complication. For the capacitor, C2 in Table 1, that is, a thin-film capacitor is used in the drawings because it requires a very small capacitance.

Next, steps for producing the multilayer wiring substrate will be described using cross-sectional views of FIGS. 2A to 2AF.

Figure 2A:
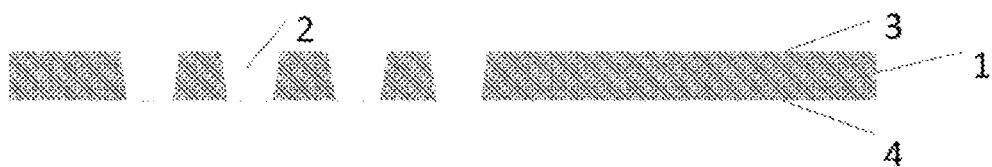
FIG. 2A is a cross-sectional view showing a process for producing a multilayer wiring substrate according to the first embodiment of the present invention.

In FIG. 2A, through holes 2 are formed in a core glass 1. The type of core glass 1 may be freely selected from non-alkali glass, alkali glass, and quartz glass, depending on the application, but in the first embodiment, 300 μm-thick non-alkali glass was used. The processing method of the through hole 2 may be suitably selected from laser processing, etching processing, electric discharge processing and combinations thereof, but in the first embodiment, laser processing is employed.

Figure 2B:
FIG. 2B is a cross-sectional view showing a process for producing the multilayer wiring substrate according to the first embodiment of the present invention.

Then, as shown in FIG. 2B, a carrier glass 9 is adhered to one surface of the core glass 1. An adhesive layer 10 is formed on one surface of the carrier glass.

In FIG. 2A, the through holes differ in their diameters on the front and rear surfaces of the core glass. Although this is not required, for the sake of ease of explanation, the surface having the larger hole diameter is referred to as a first surface 3 of the core glass, and the surface having the smaller hole diameter is referred to as a second surface 4 of the core glass.

Figure 2C:
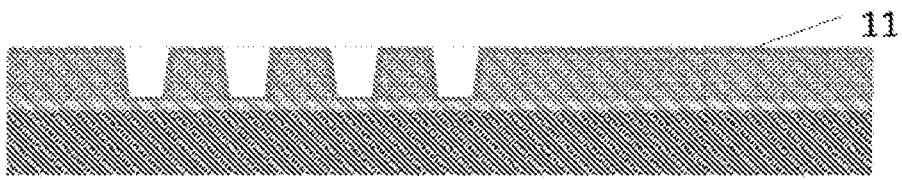
FIG. 2C is a cross-sectional view showing a process for producing the multilayer wiring substrate according to the first embodiment of the present invention.

After the carrier glass 9 is adhered, as shown in FIG. 2C, a thin film 11 of a conductor is formed on the first surface 3 of the core glass 1 and the inner wall portion of the through hole 2. The thin film becomes a seed of the conductive layer in the first surface of the core glass and in the through hole, and also becomes a lower electrode 14 of the thin-film MIM capacitor through subsequent processing. The material of the conductive thin film may be freely selected from titanium, chromium, palladium, etc. according to the application, but chromium is used in the first embodiment.

Figure 2D:
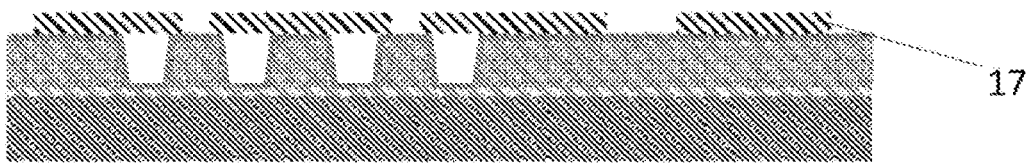
FIG. 2D is a cross-sectional view showing a process for producing the multilayer wiring substrate according to the first embodiment of the present invention.

In FIG. 2D, a resist pattern 17 is formed on the first surface 3 of the glass core 1. In the first embodiment, a portion where a conductive wire is to be formed, a portion where the conductive seed is to be formed on the inner wall of the through hole, and a portion where the lower electrode of the thin-film MIM capacitor is to be disposed are covered with the resist 17.

Figure 2E:
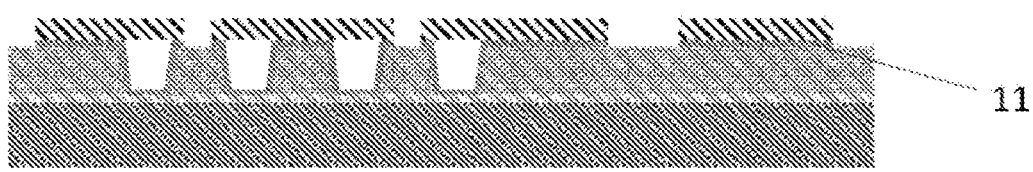
FIG. 2E is a cross-sectional view showing a process for producing the multilayer wiring substrate according to the first embodiment of the present invention.
Figure 2F:
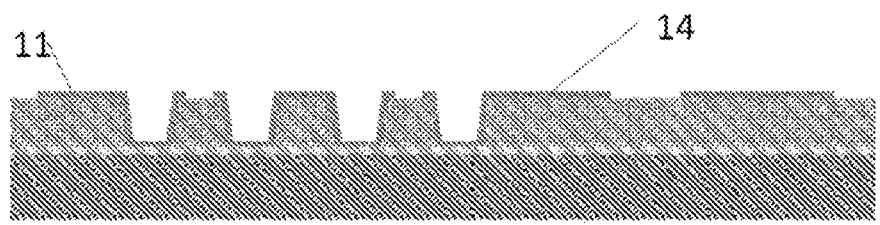
FIG. 2F is a cross-sectional view showing a process for producing the multilayer wiring substrate according to the first embodiment of the present invention.

In FIG. 2E, a chromium layer 11 is removed from the portion not covered with the resist 17 by a method such as dry etching. Subsequently, in FIG. 2F, the resist 17 is stripped to expose the conductive thin film layer on the first surface 3 of the glass core 1.

Figure 2G:
FIG. 2G is a cross-sectional view showing a process for producing the multilayer wiring substrate according to the first embodiment of the present invention.
Figure 2H:
FIG. 2H is a cross-sectional view showing a process for producing the multilayer wiring substrate according to the first embodiment of the present invention.

In FIG. 2G, a dielectric layer 13 is formed on the first surface 3 of the glass core 1. The dielectric layer 13 is disposed on the entire surface of the first surface 3 without masking with a resist or the like. Next, as shown in FIG. 2H, a resist pattern 18 is formed on the dielectric layer 13 on the first surface 3. A resist is set to be left at a part where the dielectric is to be arranged. In this example, it is intended to leave the dielectric only in the dielectric layer of the thin-film MIM capacitor and in portions extending therefrom. As a characteristic point of the first embodiment, a dielectric layer is provided to the inner wall of at least one of the through holes in the vicinity of the portion where the thin-film MIM capacitor is placed. As a result, in the inner wall of the through hole, a conductive layer extended from a lower electrode layer 14 is first stacked on the side wall, and the dielectric layer 13 is laminated in a state of covering the conductive layer.

Figure 2I:
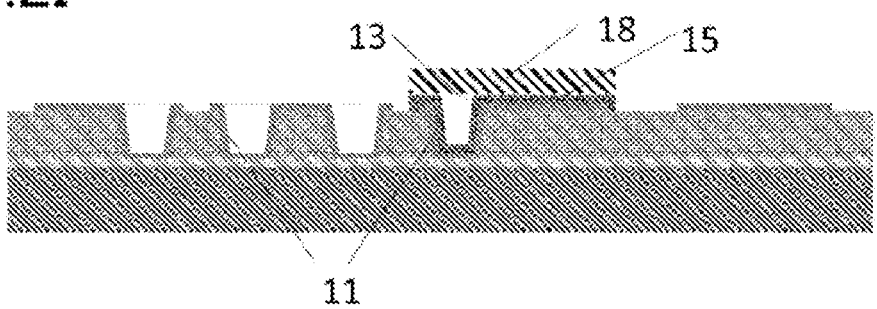
FIG. 2I is a cross-sectional view showing a process for producing the multilayer wiring substrate according to the first embodiment of the present invention.
Figure 2J:
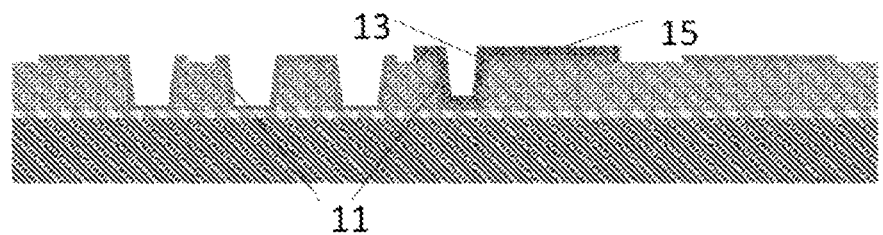
FIG. 2J is a cross-sectional view showing a process for producing the multilayer wiring substrate according to the first embodiment of the present invention.

In FIG. 2I, the dielectric not covered by resist 18 is removed by etching. Then, as shown in FIG. 2J, the resist 18 is removed.

Figure 2K:
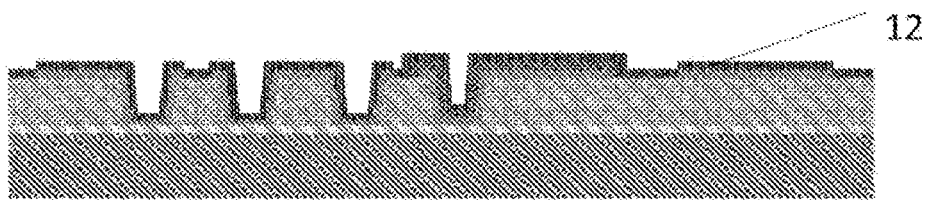
FIG. 2K is a cross-sectional view showing a process for producing the multilayer wiring substrate according to the first embodiment of the present invention.

Next, as shown in FIG. 2K, a conductive layer is laminated on the entire surface of the first surface 3 of the glass core 1. The material used for the conductive layer is not necessarily the same material as that used for the conductor in which the lower electrode layer was previously formed. As a result of laminating the conductive layer, on the first surface 3 of the glass core 1, there coexist different types of portions which are a portion in which this conductor is directly laminated on the glass surface, a portion in which the conductor is laminated on the dielectric layer, and a portion where the conductor layer is laminated over the conductor layer and the dielectric layer.

At this stage, since the first surface 3 of the glass core 1 is entirely conductive, the conductive wire is raised by electrolytic plating.

Figure 2L:
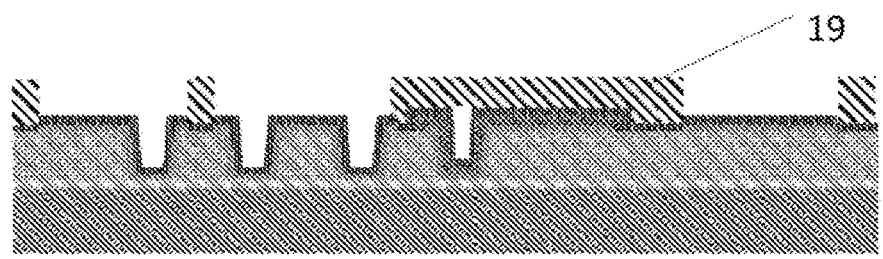
FIG. 2L is a cross-sectional view showing a process for producing the multilayer wiring substrate according to the first embodiment of the present invention.

First, as shown in FIG. 2L, a resist pattern 19 for forming a wiring pattern is formed. This time, since the conductive wire was raised by electrolytic copper plating, the resist covers the portion where the electrolytic copper plating is not laminated.

Figure 2M:
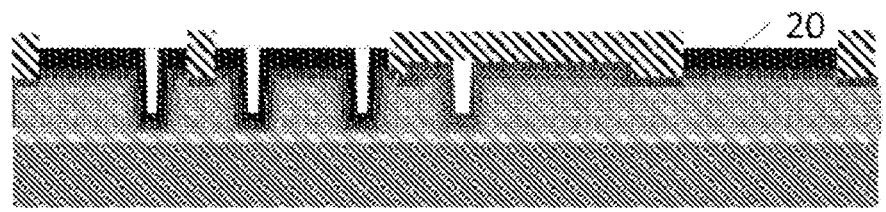
FIG. 2M is a cross-sectional view showing a process for producing the multilayer wiring substrate according to the first embodiment of the present invention.

Then, as shown in FIG. 2M, a conductive wire portion 20 was raised by electrolytic copper plating. The target thickness of the conductive wire is 10 μm.

Figure 2N:
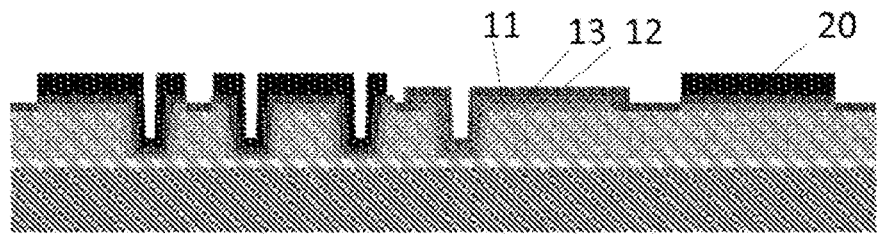
FIG. 2N is a cross-sectional view showing a process for producing the multilayer wiring substrate according to the first embodiment of the present invention.

In FIG. 2N, a resist 19 is stripped.

Next, the shape of the micro MIM capacitor is completed and unnecessary conductive seeds are removed.

Figure 2O:
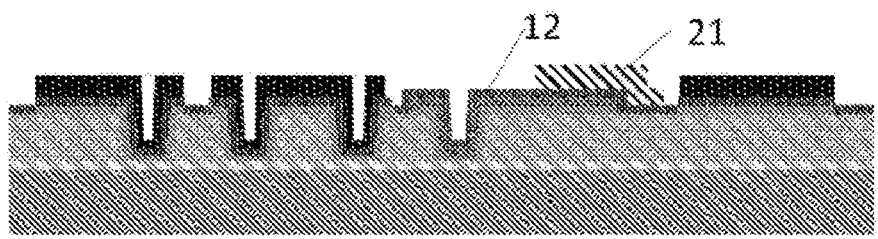
FIG. 2O is a cross-sectional view showing a process for producing the multilayer wiring substrate according to the first embodiment of the present invention.

First, as shown in FIG. 2O, a resist pattern 21 is formed to cover a part of a micro MIM capacitor 6 and the portion extended from an upper electrode 16. A characteristic feature is that the through hole formed with the conductive material as shown in FIG. 2K is laminated in the order of the conductor 11, the dielectric 13, and the conductor 12 starting from the one closest to the wall surface. However, the through hole is not covered with the resist 21, and the conductor 12 laminated on the through hole is removed by etching performed in the next step.

Figure 2P:
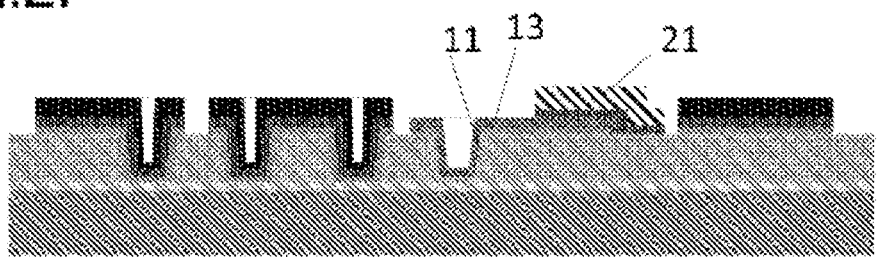
FIG. 2P is a cross-sectional view showing a process for producing the multilayer wiring substrate according to the first embodiment of the present invention.

After the resist pattern 21 is formed, as shown in FIG. 2P, the conductive seed layer serving also as the conductive layer of the capacitor electrode is removed. In the first embodiment, since a chromium thin film is formed, a chemical solution for selectively etching chromium is used.

Accordingly, the micro MIM capacitor 6 and the necessary conductive wire 20 are provided, and the through electrode 22 for electrical connection with the second surface 4 of the glass core 1 is also prepared, thereby completing the first surface of the glass core 1.

Subsequently, a build-up layer is formed.

Figure 2Q:
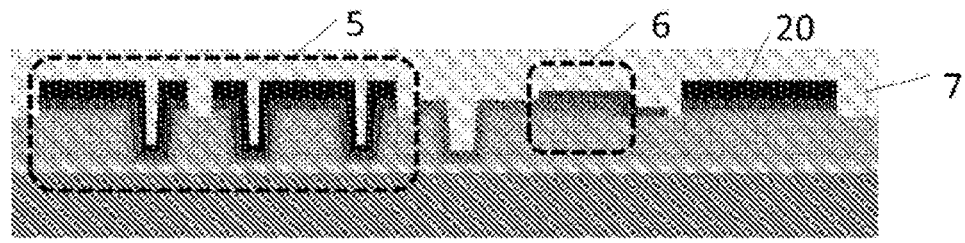
FIG. 2Q is a cross-sectional view showing a process for producing the multilayer wiring substrate according to the first embodiment of the present invention.

First, as shown in FIG. 2Q, an insulator layer 7 having a thickness sufficient to include all of the conductive wire 20 and the micro MIM capacitor 6 which are disposed on the first surface 3 of the glass core 1 is laminated on the entire surface of the first surface 3.

Figure 2R:
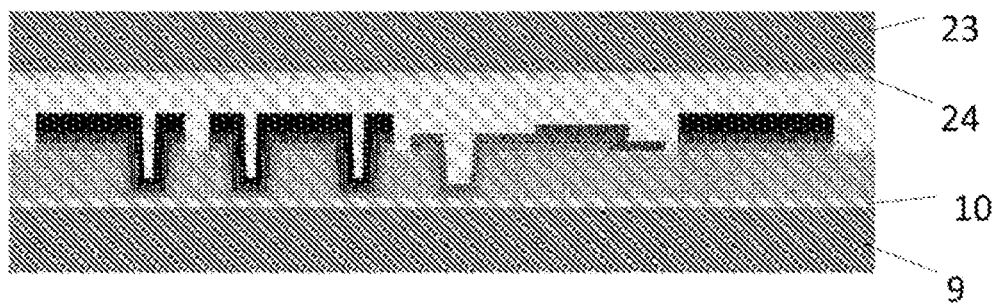
FIG. 2R is a cross-sectional view showing a process for producing the multilayer wiring substrate according to the first embodiment of the present invention.

Then, as shown in FIG. 2R, the glass carrier 23 is adhered to the insulating resin layer 7 on the first surface 3 side of the glass core 1.

Figure 2S:
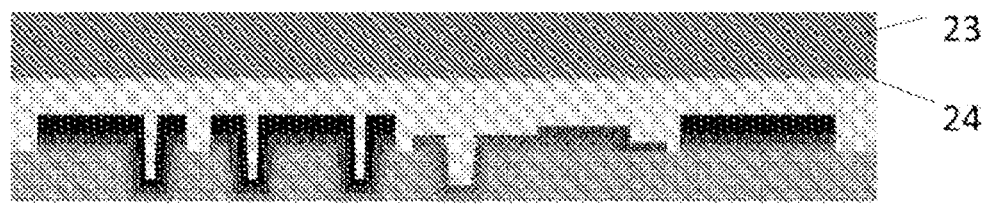
FIG. 2S is a cross-sectional view showing a process for producing the multilayer wiring substrate according to the first embodiment of the present invention.

Then, as shown in FIG. 2S, a carrier glass 9 on the second surface 4 side of the glass core 1 is stripped.

Subsequently, a conductor wiring layer 25 is formed on the second surface 4 of the glass core 1.

Figure 2T:
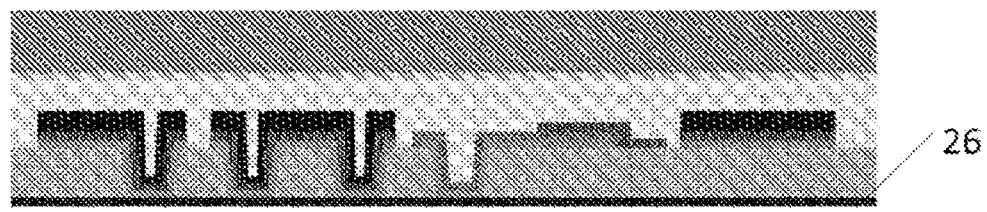
FIG. 2T is a cross-sectional view showing a process for producing the multilayer wiring substrate according to the first embodiment of the present invention.

First, as shown in FIG. 2T, a conductive seed film 26 is formed directly on the second surface 4 of the glass core 1. The material constituting the film and the film forming method may be appropriately selected, but in the first embodiment, a copper layer was laminated on a Ti layer by sputtering.

Figure 2U:
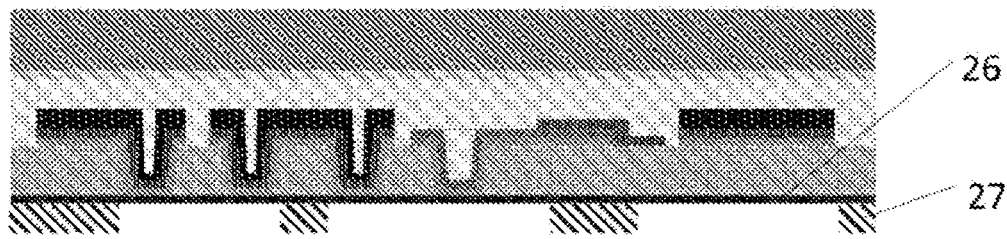
FIG. 2U is a cross-sectional view showing a process for producing the multilayer wiring substrate according to the first embodiment of the present invention.

Then, as shown in FIG. 2U, a resist pattern 27 is formed to cover the portion other than the portion where the conductive wire is to be formed.

Figure 2V:
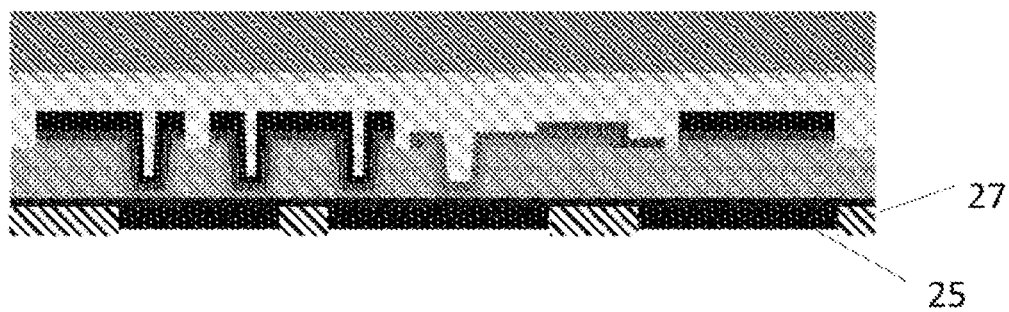
FIG. 2V is a cross-sectional view showing a process for producing the multilayer wiring substrate according to the first embodiment of the present invention.

As shown in FIG. 2V, a portion of the seed layer 26 exposed from the resist pattern is raised to form a main layer of the wiring layer 25. The raising method may be appropriately selected, but in the first embodiment, copper was laminated at a thickness of 10 μm using electrolytic copper plating.

Figure 2W:
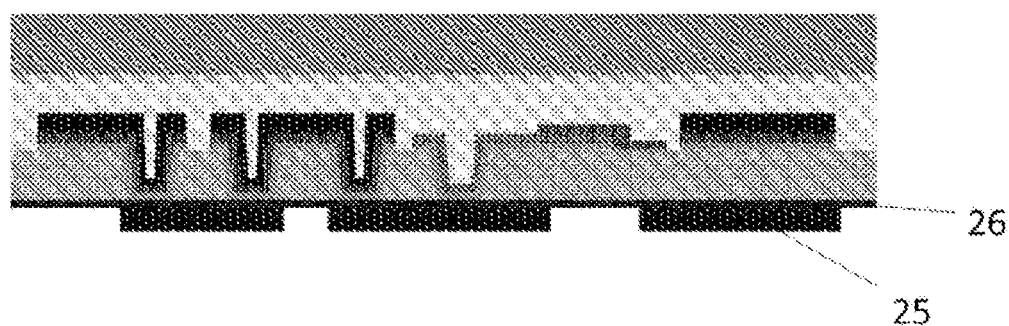
FIG. 2W is a cross-sectional view showing a process for producing the multilayer wiring substrate according to the first embodiment of the present invention.
Figure 2X:
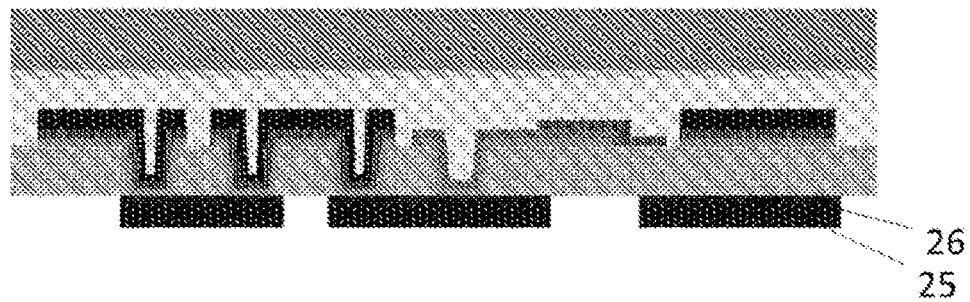
FIG. 2X is a cross-sectional view showing a process for producing the multilayer wiring substrate according to the first embodiment of the present invention.

Then, as shown in FIG. 2W, the resist pattern is stripped by immersion in the peeling solution, and then, as shown in FIG. 2X, the seed layer covered with the resist is removed. The method of removing the seed layer may be appropriately selected, but in the first embodiment, the copper layer of the seed layer was removed by flash etching so that the main layer of the wiring was hardly affected, followed by the removal of the titanium film by etching.

Figure 2Y:
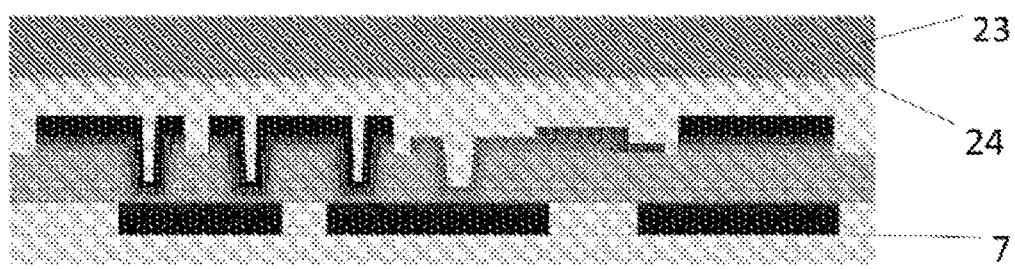
FIG. 2Y is a cross-sectional view showing a process for producing the multilayer wiring substrate according to the first embodiment of the present invention.

Subsequently, as shown in FIG. 2Y, an insulating resin layer having a thickness sufficient to cover all the conductive wires on the second surface 4 of the glass core 1 is laminated on the wiring layer. In the first embodiment, the thickness of the insulating layer was set to 25 μm, and a method of laminating sheet-like insulating resin by a vacuum press laminator was used.

Figure 2Z:
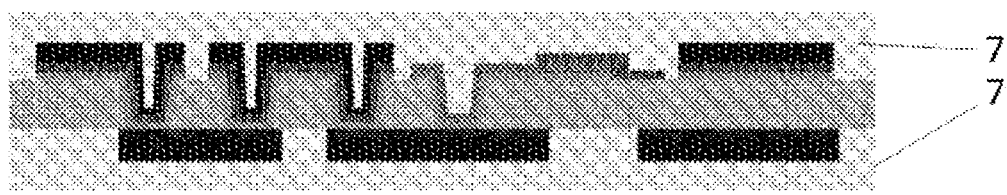
FIG. 2Z is a cross-sectional view showing a process for producing the multilayer wiring substrate according to the first embodiment of the present invention.
Figure 2A:
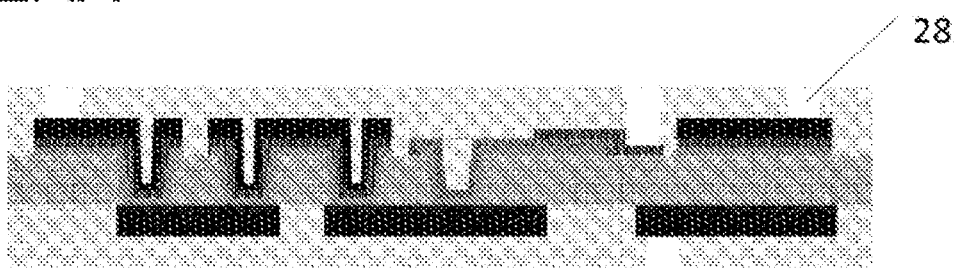
Figure 2A:
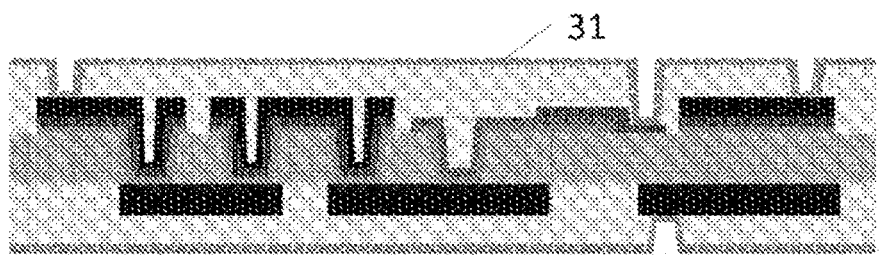
Figure 2A:
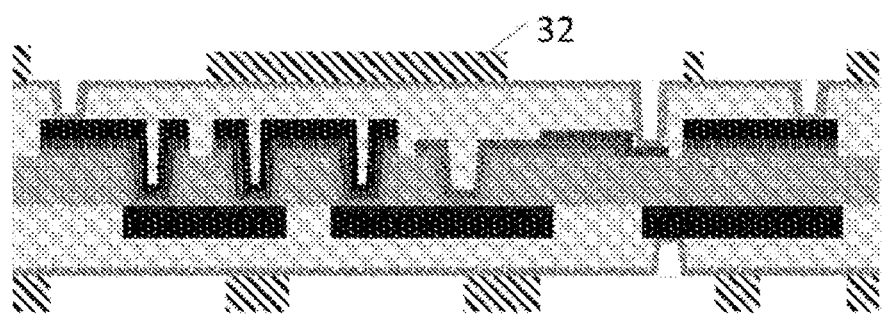
Figure 2A:
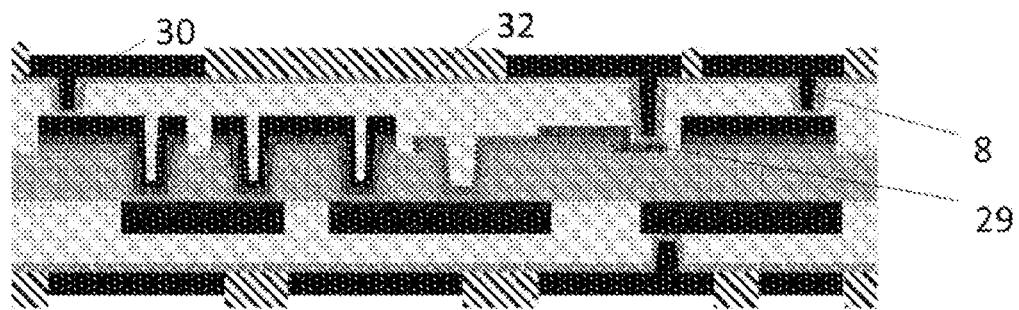
Figure 2A:
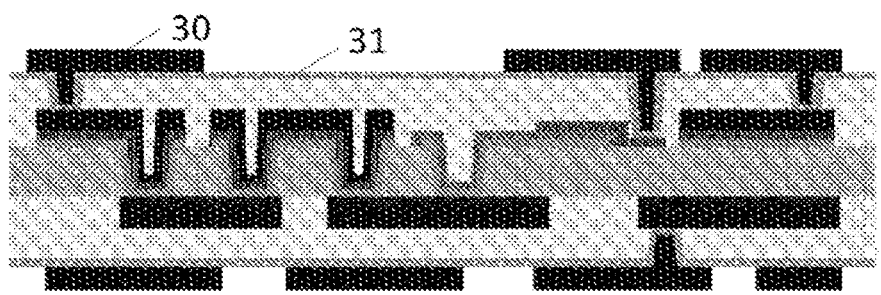
Figure 2A:
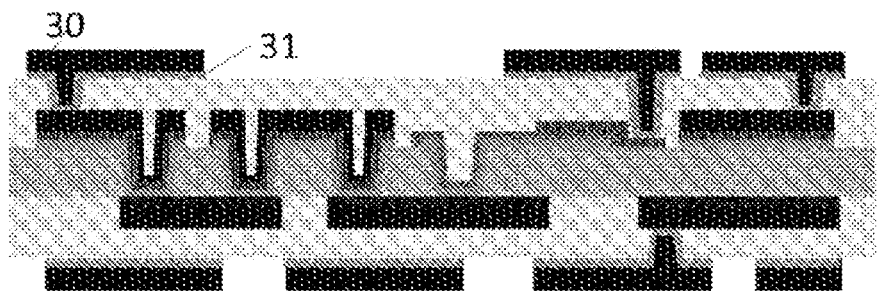

Subsequently, as shown in FIG. 2Z, the glass carrier 23 adhered to the first surface 3 of the glass core 1 was stripped.

At this point, the glass core 1 has wiring layers on both surfaces, and an insulating resin layer is laminated thereon. The glass carrier was not used thereafter.

Thereafter, the glass carrier is not adhered to either surface of the glass core 1, and there is no difference in the processing method between the first surface 3 and the second surface 4 of the glass core 1. Processing may be performed from either surface, or a portion capable of being processed simultaneously from both surfaces may be simultaneously processed from both surfaces. In the following description and the annotation of the drawings, it is described as if both surfaces were processed simultaneously, but these are only for convenience, and processing one surface at a time and processing both surfaces simultaneously can be combined according to the convenience of processing.

As shown in FIG. 2AA, to form conductive vias in the insulating resin layer 7, through holes 28 are formed in portions where conduction with the lower conductive layer was desired. The size and processing method of the through holes may be freely selected, but in the first embodiment, the through hole was processed by a laser beam machine so that the hole diameter at the inlet side was 60 μm and the hole diameter at the bottom was 50 μm.

In connection with the thin-film MIM capacitor 6 formed on the first surface 3 of the glass core 1, the connection from the upper electrode 12 extends from the terminal 29 extending from the capacitor portion of the upper electrode to the upper buildup layer via a via, and is connected to a conductive wire 30 on the build-up layer.

In the connection from the lower electrode, a metal thin film extending from the lower electrode capacitor portion is led out to the second surface 4 of the glass core 1 through the glass through electrode in the vicinity of the lower electrode capacitor portion, and is led out from the through electrode to the wiring layer 25 at the terminal of the conductor wiring layer 25 arranged at the portion where the metal thin film is led out.

Subsequently, as shown in FIG. 2AB, a conductive seed layer 31 was formed on the surface of the insulating resin for buildup and on the inner wall of the through hole. The type and formation method of the conductive seed layer may be freely selected according to the purpose. In the first embodiment, copper was laminated at a thickness of approximately 600 nm by electroless copper plating.

Next, the wiring layer of the build-up layer was laminated.

First, as shown in FIG. 2AC, a resist pattern 32 is formed to cover the portion of the insulating layer surface of the build-up layer other than the portion where the wiring is to be formed.

Then, as shown in FIG. 2AD, a conductor is laminated to raise the wiring seed layer other than the portion covered with the resist. Although the material to be laminated and the laminating method may be appropriately selected, in the first embodiment, copper is laminated by electrolytic copper plating at a thickness of approximately 10 μm. Copper plating was also applied to the inside of the insulating resin layer to form a through electrode via 33.

Then, as shown in FIG. 2AE, a resist 32 was stripped. Then, as shown in FIG. 2AF, the conductive seed layer other than the portion where the conductive wire is disposed was stripped. In the first embodiment, flash etching was performed with a chemical solution having selective etching properties for copper, and only the copper layer of the conductive seed layer was dissolved and removed under conditions that had little effect on copper which is the main layer of the conductive wire.

With respect to the first embodiment, although the description of the processing steps ends here in order to describe the main points of the process, the desired number of layers can be built up by repeating the steps of laminating the conductor wirings, forming the through vias, and forming the conductor wiring layer as necessary.

As described above, according to the first embodiment, by using a glass core suitable for a high-frequency electronic substrate to obtain good electrical characteristics, and by incorporating an LC filter into the multilayer structure, it is possible to effectively utilize the mounting area of the substrate. Additionally, at the same time, by forming a thin film utilizing the smoothness of the glass, it is possible to arrange a capacitor having an extremely small electric capacitance in a space-saving manner.

Second Embodiment

A second embodiment of the present invention will now be described with reference to the drawings. The present invention is not limited to the second embodiment.

In the description of the drawings, the same components are given the same reference signs.

A multilayer wiring substrate 118 according to the second embodiment has a through hole 102 in a core substrate 101 and a thin-film capacitor structure 106 on the laminated surface. The capacitor structure serves as an electronic component which forms an LC resonance circuit or a capacitive passive component used in wireless communication such as mobile devices.

Figure 5:
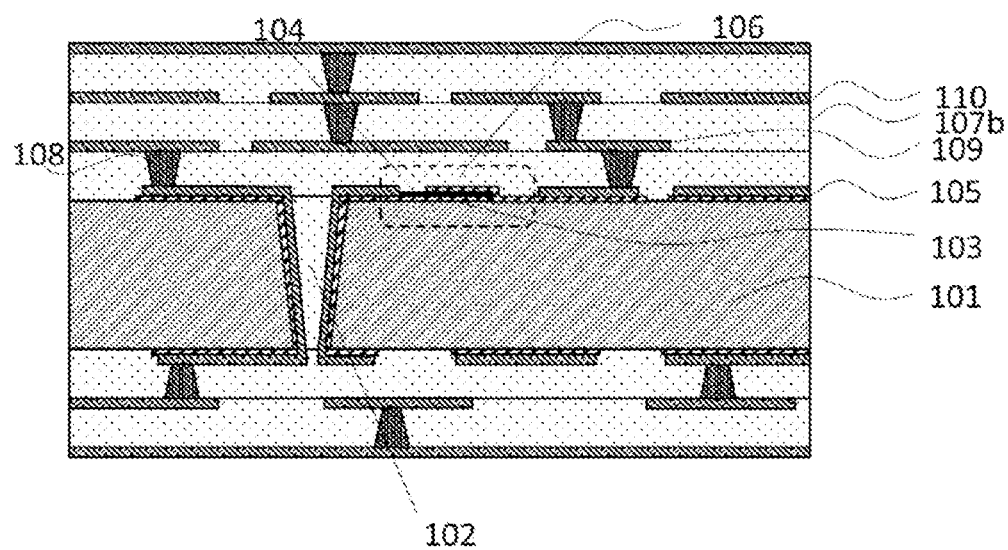
FIG. 5 is a cross-sectional view of a multilayer wiring substrate having an MIM structure according to a second embodiment of the present patent.

In FIG. 5, the multilayer wiring substrate 118 includes a glass substrate as the core substrate 101.

The through hole 102 is formed on the core substrate 101 in the lamination direction of the multilayer wiring substrate. When the top surface in the cross-section of the core substrate 101 is referred to as a front surface, and the bottom surface is referred to as a rear surface, conductive layers and insulating resin layers are alternately laminated on each of the front and rear surfaces. The through hole 102 is formed in the core substrate 101 and an interlayer via 108 is formed in an insulating resin layer 107 as a portion for electrically connecting adjacent conductor layers.

Figure 6A:
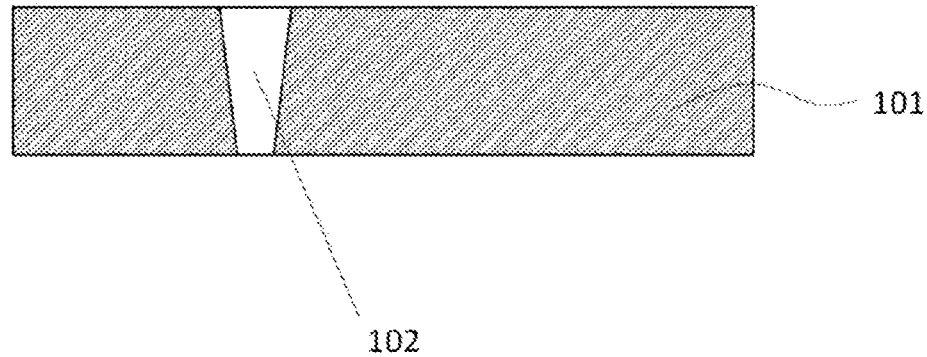
FIG. 6A is a cross-sectional view showing a process for producing a multilayer wiring substrate according to the second embodiment of the present invention.

Next, steps for producing the multilayer wiring substrate 118 will be described using cross-sectional views of FIGS. 6A to 6T. In FIGS. 6A to 6T, the description of the back surface of the core substrate 101 is omitted.

As shown in FIG. 6A, the through hole 102 is formed on the core substrate 101.

Figure 6B:
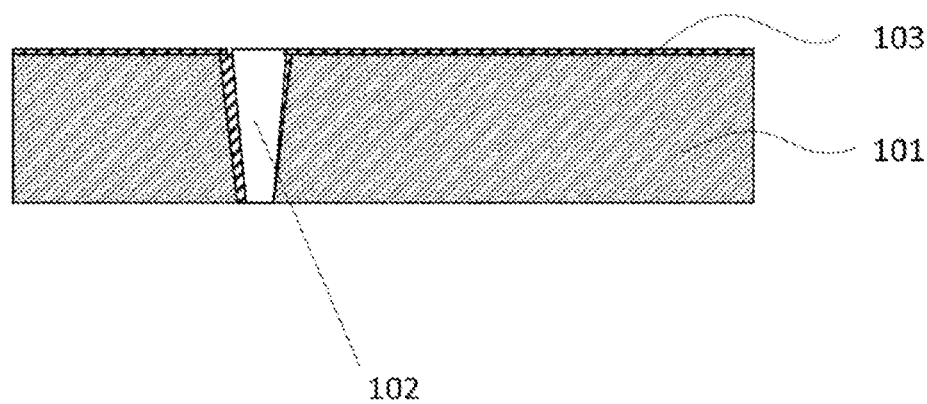
FIG. 6B is a cross-sectional view showing a process for producing the multilayer wiring substrate according to the second embodiment of the present invention.

In FIG. 6B, a chromium thin film is formed on the front and rear surfaces of the core substrate and the inner wall surface of the through hole 102. Further, the chromium thin film becomes the first conductive film 103 on the front and rear of the core substrate.

Figure 6C:
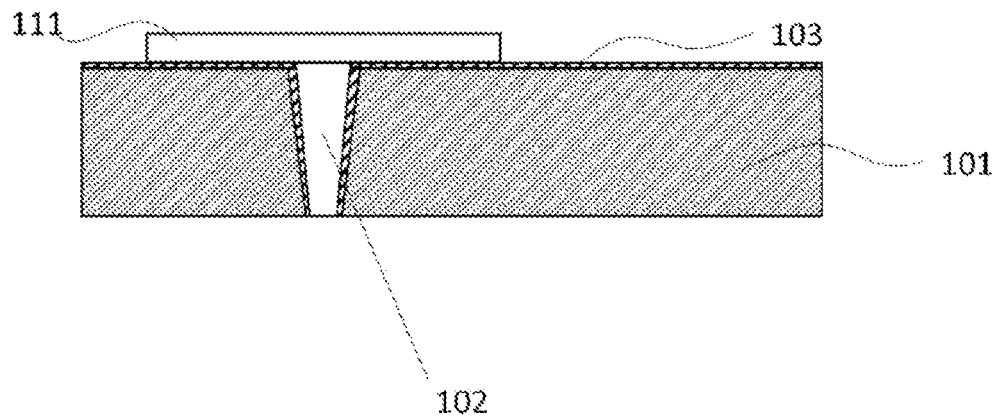
FIG. 6C is a cross-sectional view showing a process for producing the multilayer wiring substrate according to the second embodiment of the present invention.

In FIG. 6C, in order to form the first conductive film 103, a resist pattern is formed by photolithography using a resist 111.

Figure 6D:
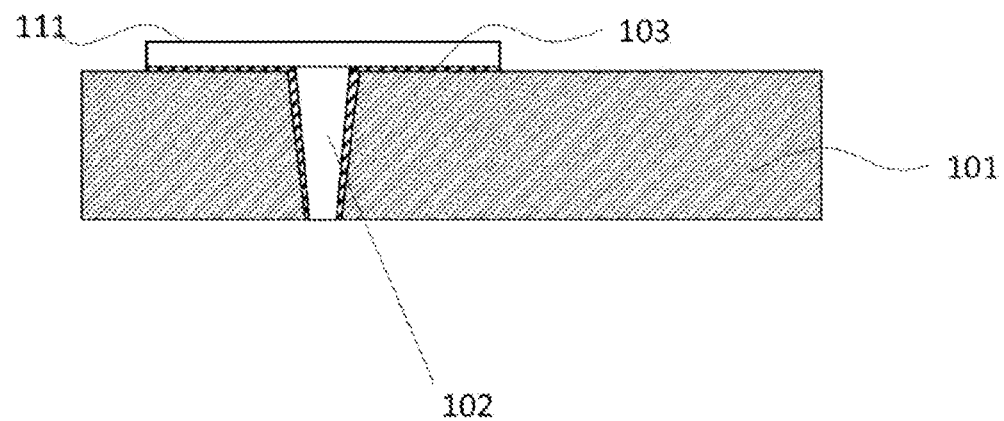
FIG. 6D is a cross-sectional view showing a process for producing the multilayer wiring substrate according to the second embodiment of the present invention.

In FIG. 6D, the conductive wire in which the thin-film capacitor structure 106 is to be formed is left at a predetermined position covered with a resist, and the exposed chromium conductive wire is removed by an acidic etching solution.

Figure 6E:
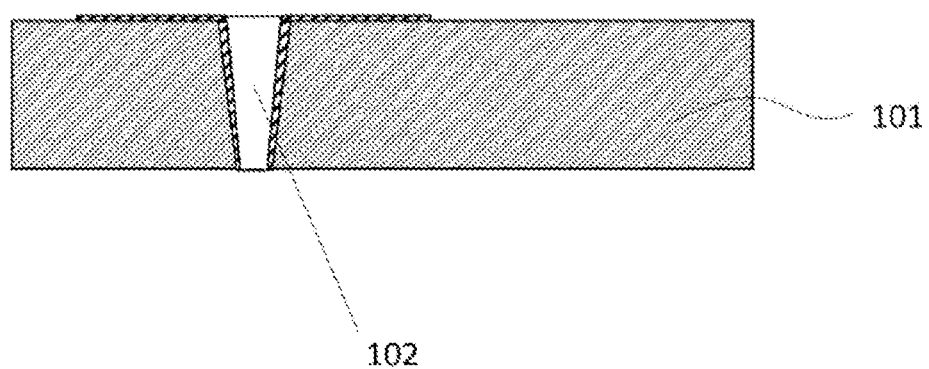
FIG. 6E is a cross-sectional view showing a process for producing the multilayer wiring substrate according to the second embodiment of the present invention.

In FIG. 6E, the resist 111 is removed, leaving the conductive wire of the first conductive film 103 on the substrate.

Figure 6F:
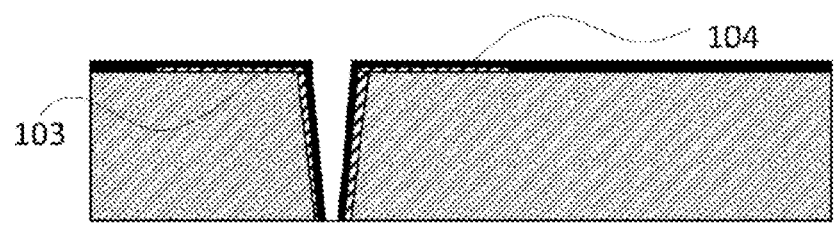
FIG. 6F is a cross-sectional view showing a process for producing the multilayer wiring substrate according to the second embodiment of the present invention.

In FIG. 6F, a dielectric layer 104 is formed on the first conductive film by sputter deposition.

Figure 6G:
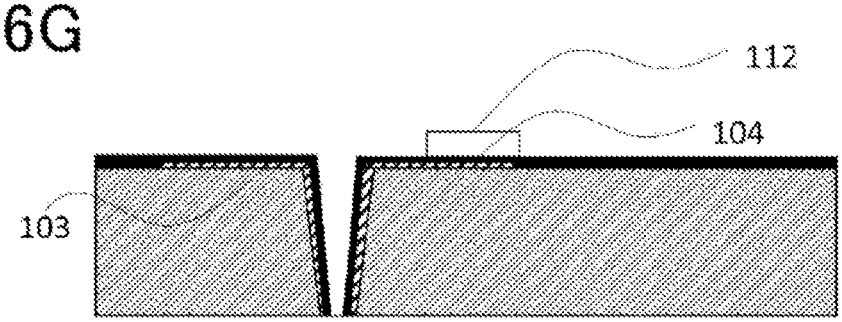
FIG. 6G is a cross-sectional view showing a process for producing the multilayer wiring substrate according to the second embodiment of the present invention.
Figure 6H:
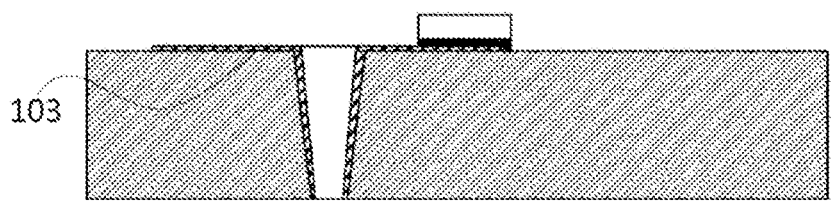
FIG. 6H is a cross-sectional view showing a process for producing the multilayer wiring substrate according to the second embodiment of the present invention.
Figure 6I:
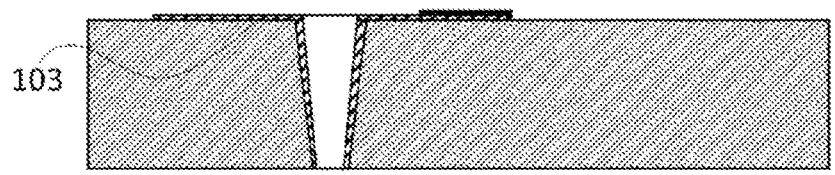
FIG. 6I is a cross-sectional view showing a process for producing the multilayer wiring substrate according to the second embodiment of the present invention.

In FIG. 6G, the capacitor pattern portion of the dielectric layer 104 and the conductive wire of the first conductive film 103 are covered by a resist for dielectric 112. In this state, as shown in FIG. 6H, patterning is performed by dry etching, leaving only the layer structure of the lower electrode and the dielectric. In FIG. 6I, the resist 112 is removed.

Figure 6J:
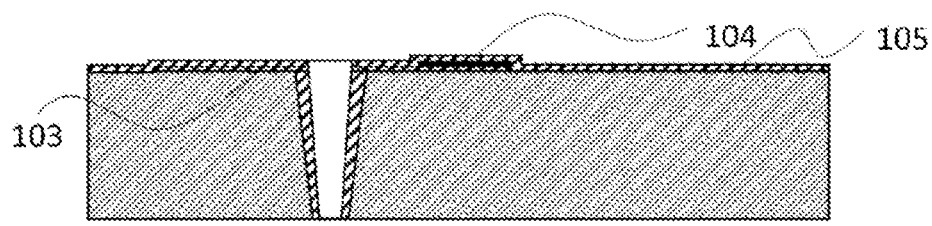
FIG. 6J is a cross-sectional view showing a process for producing the multilayer wiring substrate according to the second embodiment of the present invention.

In FIG. 6J, a second conductive film 105 is formed by sputter deposition.

Figure 6K:
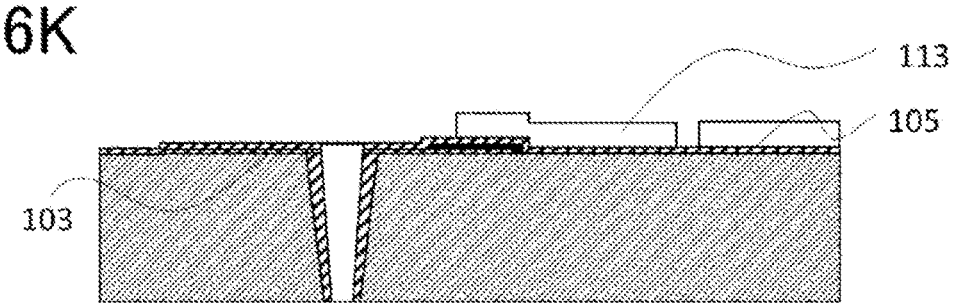
FIG. 6K is a cross-sectional view showing a process for producing the multilayer wiring substrate according to the second embodiment of the present invention.

In FIG. 6K, a resist 113 is formed on the second conductive film 105 to cover the circuit forming portion.

Figure 6L:
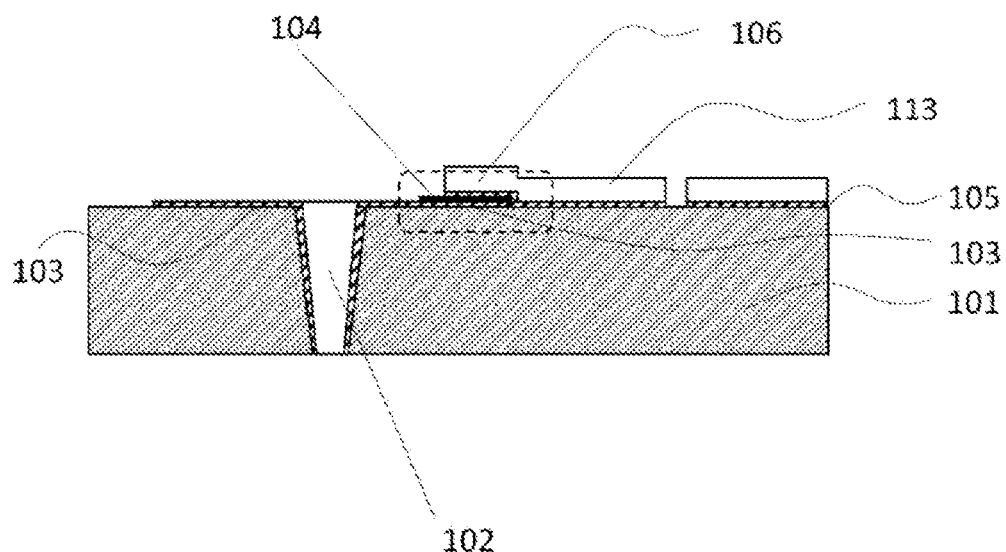
FIG. 6L is a cross-sectional view showing a process for producing the multilayer wiring substrate according to the second embodiment of the present invention.

In FIG. 6L, a thin film other than the conductive wire of the second conductive film 105 is removed by etching.

Figure 6M:
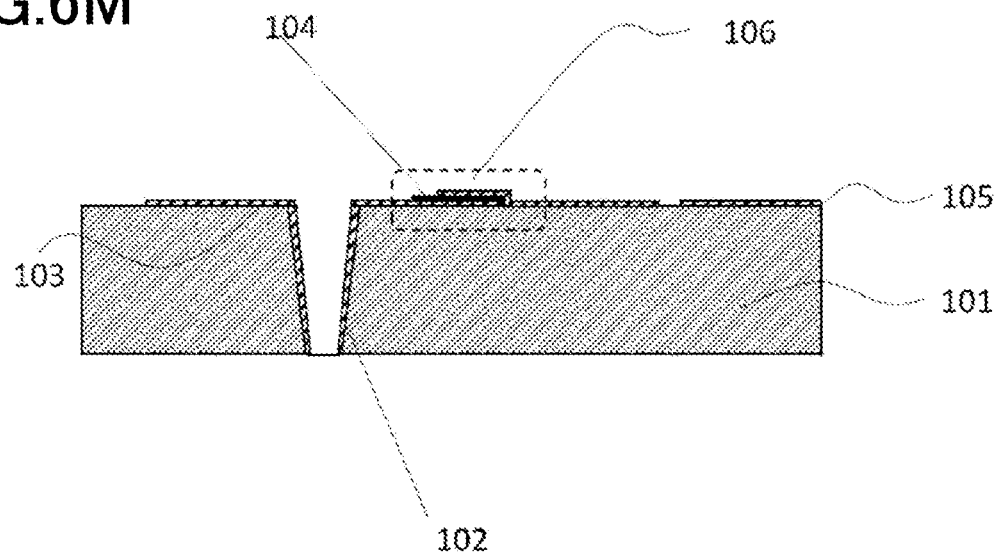
FIG. 6M is a cross-sectional view showing a process for producing the multilayer wiring substrate according to the second embodiment of the present invention.

In FIG. 6M, the second conductive film 105 is formed by stripping the resist 113 after removal of the thin film described above, thereby forming a MIM structure 106 of the second embodiment.

Figure 6N:
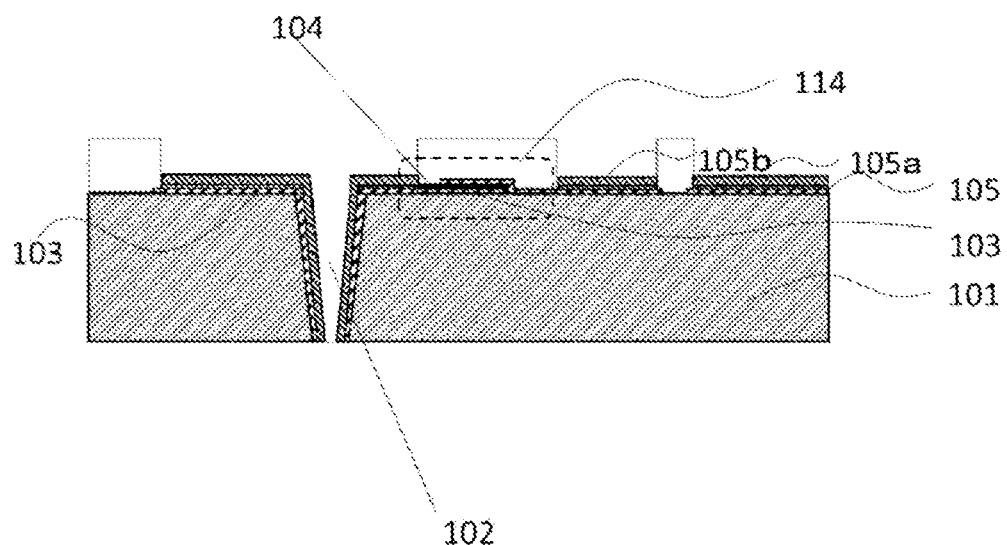
FIG. 6N is a cross-sectional view showing a process for producing the multilayer wiring substrate according to the second embodiment of the present invention.

In FIG. 6N, a resist 114 is formed at a portion functioning as the MIM structure 106 and a portion maintaining insulation directly above the substrate, and plating is performed to increase the conductor thickness of second conductive film 105.

Figure 6O:
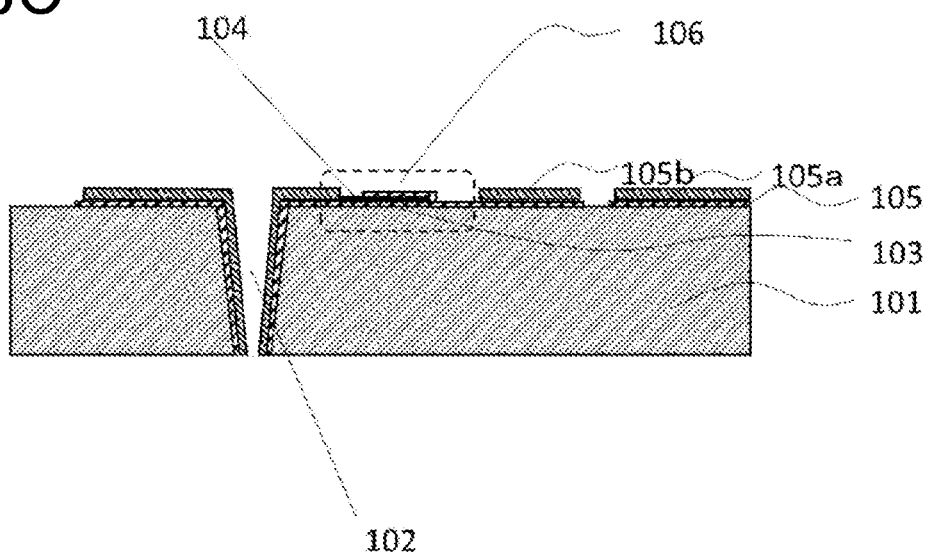
FIG. 6O is a cross-sectional view showing a process for producing the multilayer wiring substrate according to the second embodiment of the present invention.

In FIG. 6O, the unwanted resist 114 is removed.

Figure 6P:
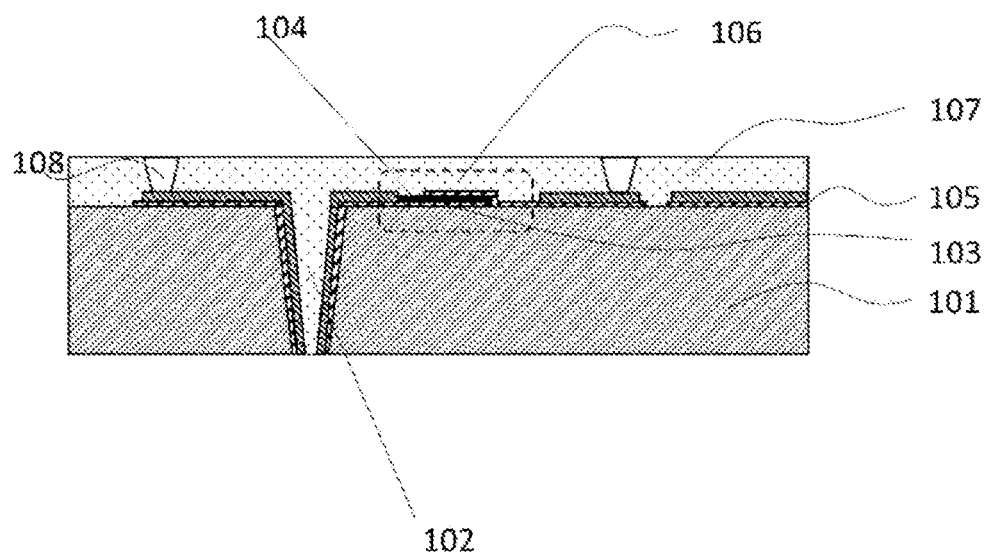
FIG. 6P is a cross-sectional view showing a process for producing the multilayer wiring substrate according to the second embodiment of the present invention.
Figure 6Q:
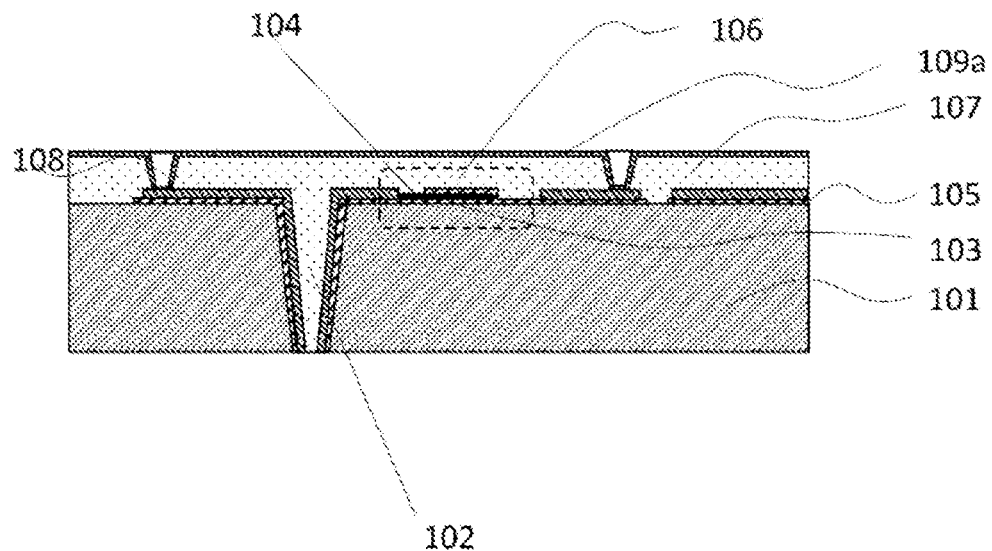
FIG. 6Q is a cross-sectional view showing a process for producing the multilayer wiring substrate according to the second embodiment of the present invention.
Figure 6R:
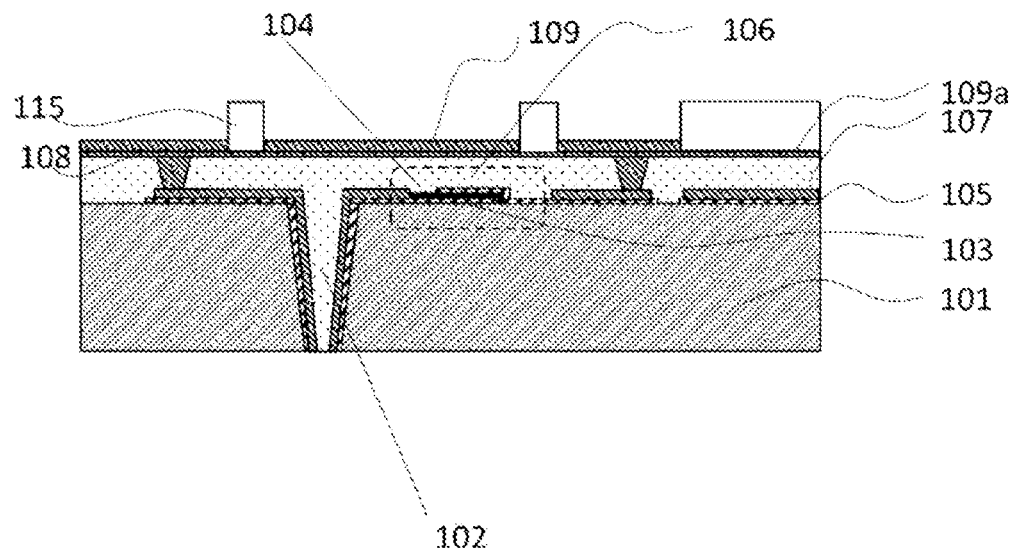
FIG. 6R is a cross-sectional view showing a process for producing the multilayer wiring substrate according to the second embodiment of the present invention.
Figure 6S:
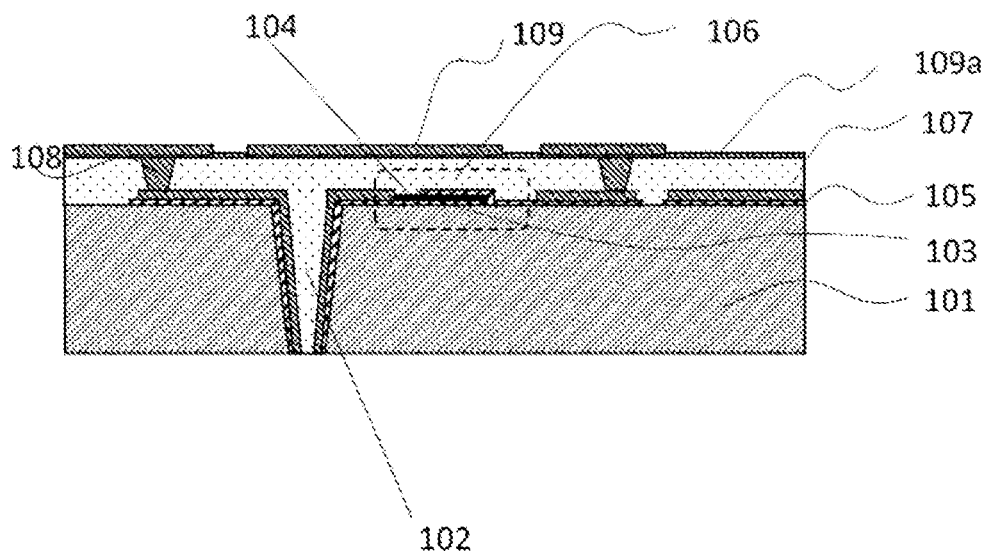
FIG. 6S is a cross-sectional view showing a process for producing the multilayer wiring substrate according to the second embodiment of the present invention.
Figure 6T:
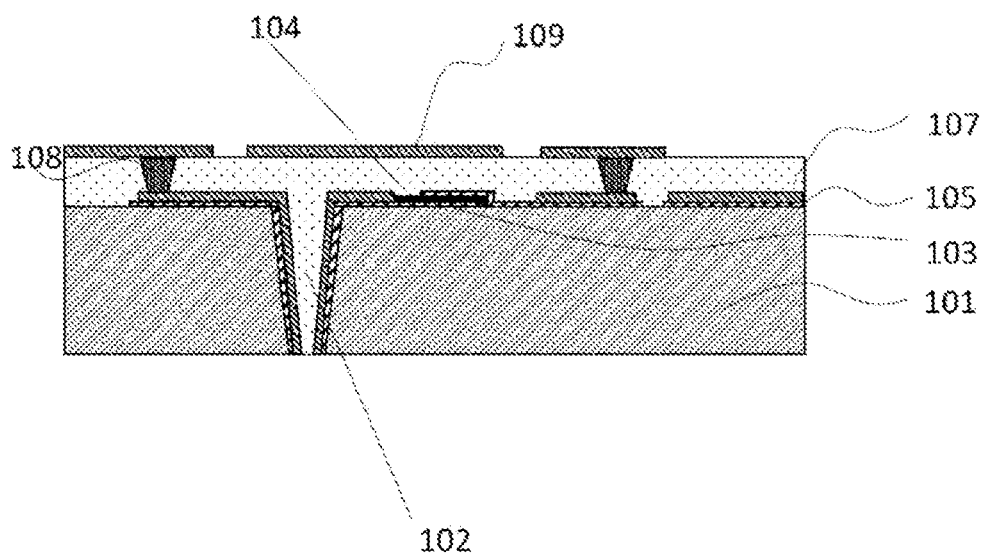
FIG. 6T is a cross-sectional view showing a process for producing the multilayer wiring substrate according to the second embodiment of the present invention.

In FIG. 6P, an insulating resin layer 107 is formed on the upper surface where the second wiring layer 105 and the MIM structure 106 are formed, and in FIGS. 6Q to 6T, the interlayer via 108 is formed on the second wiring layer 105 connected from the lead line from the MIM structure 106, and the conductive wire is led out to a third conductive layer 109 through the interlayer via 108.

The interlayer via 108 and the wiring drawn from the second conductive film are electrically connected to the circuit for applications such as signal lines or GND connections.

By repeating the process shown in FIGS. 6P to 6T, the fourth conductive layer 110 is formed on the second insulating resin 107b. The multilayer wiring substrate 118 is formed by laminating any number of layers in this manner.

The individual elements will now be described in terms of materials, shapes, physical properties, and preferred performance.

The core substrate 101 may be, but is not limited to be, made of glass, ceramics, organic resins, semiconductors, or a composite material thereof as long as the substrate is a substrate on which a resonant circuit of an inductor and a capacitor is formed or a substrate on which a passive component of either the inductor and the capacitor is formed.

The core substrate 101 needs to be superior in the dimensional stability. The coefficient of linear expansion is desirably −0.5 ppm/K or more and 15.0 ppm/K or less. Since the multilayer wiring substrate of the second embodiment can also be used such as for mounting semiconductor components, the core substrate 101 preferably has a coefficient of linear expansion equivalent to that of a silicon chip, which is approximately 4 ppm/K.

Furthermore, the core substrate 101 needs to be formed of a material with low hygroscopicity. This is because if the inside of the core substrate 101 absorbs moisture, outgassing occurs, which lowers the reliability of the interlayer connection in the substrate.

Glass substrates are inexpensive, have excellent surface flatness and insulation properties, and are suitable for forming high-frequency circuits. Examples of the glass include non-alkali glass, alkali glass, borosilicate glass, quartz glass, sapphire glass, and photosensitive glass.

In the second embodiment, non-alkali glass is used in view of high-frequency application and formation of fine wiring. For the core substrate 101 which uses glass in the present embodiment, any method may be used for forming the glass substrate, and the method is not limited to a specific method. Functions such as imparting strength and antistatic properties may be imparted by surface treatment.

The thickness of the core substrate 101 is preferably 0.08 mm or more and 0.8 mm or less in view of the process for forming the through hole 102 and the handling during production. For handling the core substrate 101, the multilayer wiring substrate 118 of the second embodiment may be produced with the core substrate 101 attached to a support substrate.

The material of the support substrate is not limited to a specific material.

Subsequently, the through hole 102 of the core substrate 101 in FIG. 6A is formed by a laser, chemical treatment, electrical discharge processing, or a method combining any of these. Chemical treatment to smoothen the wall may be performed after forming the through hole 102.

As the method of forming the through hole 102, besides laser processing or electrical discharge processing, if a photosensitive resist material is used, sandblasting, dry etching, or chemical etching using hydrofluoric acid or the like may be used in this step. Laser processing or electric discharge processing is desirable because they are simple and have good throughput. The laser which can be used may be selected from a CO2 laser, an MV laser, a picosecond laser, and a femtosecond laser.

From a structural viewpoint, the opening diameter is preferably smaller than the width of the conductive wire formed in the first conductive film 103 directly above the through hole formed in the front and rear surfaces of the core substrate 101. More preferably, due to the processing accuracy in hole formation and the accuracy in photolithography, an opening having a diameter smaller than the end of the conductive wire by 10 μm or more is desirably located at a connecting portion with the conductive wire on the first conductive film 103.

In FIG. 6B, a first conductive film 103 is formed and serves as a lower electrode and a conductive wire of the MIM structure 106.

The conductor layer of the first conductive film 103 is formed on the front and rear surfaces of the glass and on the inner wall of the through hole 102 by sputtering or chemical vapor deposition (CVD).

For example, chromium, molybdenum and the like are used.

The first conductive film 103 shown in FIG. 6B is preferably formed by sputter deposition of chromium directly on glass, from the viewpoint of electrical characteristics, ease of production, and costs. In order to relax the stress directly above the glass substrate, the film thickness is preferably 200 nm or less in the formation of fine wiring by sputtering. The type of the conductor layer is used in consideration of the etching properties and the stress of the film.

The first conductive film of FIG. 6B is preferably a glass material or a material having good adhesion with copper, and chromium or molybdenum is selected. If the film thickness to be deposited is too thick, not only is it difficult to form fine wiring, but also it leads to a decrease in adhesion due to film stress and an increase in electrical resistance.

Any material may be used as long as the resistance loss is small, and good adhesion with the core substrate is achieved.

In addition to the sputter deposition process for forming the front and rear surfaces of the substrate, the method of performing an energization process to the through hole 102 includes a method of generating a primer film as a catalyst that increases the adhesion to the glass so as to increase the wettability in the hole, followed by wet deposition of copper on the wall. The perforation of the through hole 102 may be performed after the MIM structure is formed to establish electrical continuity.

The energization process to the through hole 102 may be performed by filled plating for filling the through hole 102 with a conductive material or by conformal plating. The method of energization process may be, but is not limited to, sputtering, electroless plating, electrolytic plating, filling, use of a surface treatment chemical solution, printing, coating, or a combination thereof.

In FIG. 6B, the thickness of the conductor layer deposited by sputter deposition as the first conductive film 103 on the front and rear surfaces of the core is preferably 20 nm or more and 200 nm or less.

In FIG. 6C, after the first conductive film 103 is formed, a resist pattern 111 is formed. As an example of the method for forming the resist pattern 111, the resist material to be formed can be made of a negative dry film resist, a negative liquid resist, or a positive liquid resist. In the second embodiment, a negative dry film resist was used. Roll lamination or vacuum lamination can be used for the negative dry film resist. If a liquid type is used, slit coating, curtain coating, die coating, spray coating, electrostatic coating inkjet, gravure coating, screen coating, or the like can be used.

The methods of forming the resist are not limited to the above.

In FIG. 6C, the resist pattern 111 is formed at a portion left as the first conductive film 103 by using a general photolithography technique. The resist layer 111 desirably has a thickness of 5 μm or more and 25 μm or less depending on the thickness of the conductive layer.

Further, in FIG. 6D, the first conductive film 103 other than the portion covered by the resist 111 is removed by wet etching.

Thereafter, in FIG. 6E, the resist 111 is stripped. The method of removal of the resist 111 is not limited here, but generally, a wet etching device is used to remove the resist 111 using an alkaline etching solution, but dry etching or other methods may also be used.

Next, in FIG. 6F, the dielectric layer is patterned. A thin film of silicon nitride is formed as the dielectric layer 104 by sputter deposition. The silicon nitride layer may desirably have a film thickness of 10 nm or more and 200 nm or less.

In FIG. 6G, a resist pattern is formed to cover the portion of the MIM structure 106 that remains as an electrode. In FIG. 6H, a dielectric 104 is removed from the portion exposed by dry etching.

In FIG. 6I, the resist is removed, and the structure of the first conductive film 103 and the dielectric 104 is completed.

Next, in FIG. 6J, a second chromium layer is formed as the second conductive film 105 by sputter deposition.

The thickness of the chromium conductor layer deposited by sputter deposition is preferably 20 nm or more and 200 nm or less.

In FIG. 6K, the resist 113 is formed. Before the resist 113 is formed on the surface of the second conductive film 105, the substrate may be appropriately cleaned.

In FIG. 6L, the second conductive film other than the wiring pattern is removed by wet etching using a strongly acidic chemical solution or the like. The type of chemical solution used for wet etching is not limited, except that a solution which does not corrode the glass and the material forming the dielectric layer 104 is selected.

Further, the second conductive film 105 is formed by stripping the resist 113 in FIG. 6M.

In FIG. 6M, after the second conductive film is formed, the substrate is cleaned by plasma treatment or the like as necessary.

Then, in FIG. 6N, a seed layer is formed, a resist 114 is formed, and the conductor thickness of some of the conductive wires in the second conductive film 105 is increased by electrolytic plating in the openings. The second conductive film 105 of a portion other than the MIM structure to be deposited by the plating treatment may be, for example, copper, nickel, aluminum, titanium, chromium, molybdenum, tungsten, tantalum, gold, iridium, ruthenium, palladium, platinum, or a combination thereof. Copper is more preferred because it matches the material of interlayer via 108.

In FIG. 6O, the resist 114, which is no longer required, is removed, and a seed layer 105a is removed by etching.

In FIG. 6P, the insulating resin layer 107 is formed on the upper surface of the second conductive film 105. A pad for the interlayer via 108 is formed on the extension of the pattern of the second conductive film, and processing to increase the thickness of the film is performed by electrolytic copper plating if necessary. An opening is formed through the insulating resin layer 107 to reach the second conductive film 105. When the insulating resin is a non-photosensitive resin, the opening is formed using a laser. The laser which can be used may be selected from a CO2 laser, an MV laser, a picosecond laser, and a femtosecond laser. Preferably, a laser may be an MV laser or a CO2 laser. When the insulating resin layer 107 is a photosensitive resin, an opening can be formed by photolithography. After forming the interlayer via opening, roughening of the resin surface and cleaning the inside of the opening formed in the resin are performed by desmearing using a permanganic acid solution as appropriate. This improves the adhesion to the metallic layer used in the energization process. Alternatively, cleaning of the resin surface and the inside of the opening may be performed by plasma treatment.

In FIG. 6Q, a seed layer is formed on the opening formed in the insulating resin layer 107 and the surface of the insulating resin layer 107, and the interlayer via 108 is formed.

In FIG. 6R, a resist pattern is further formed by photolithography. A conductor layer is deposited in the opening by plating.

In FIG. 6S, after the third conductive layer 109 is formed, the resist is removed, and in FIG. 6T, the seed layer used for forming the third conductive layer is removed. The insulating resin layer 107, the opening, and the third conductive layer 109 are formed by a known semi-additive process and subtractive process. Laminates may be formed by repeating the above.

Figure 8:
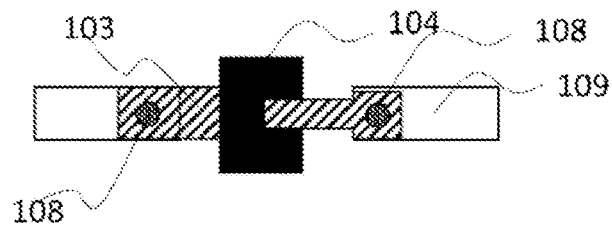
FIG. 8 is a top view of one configuration of a thin-film MIM structure according to the second embodiment of the present invention.
Figure 9:
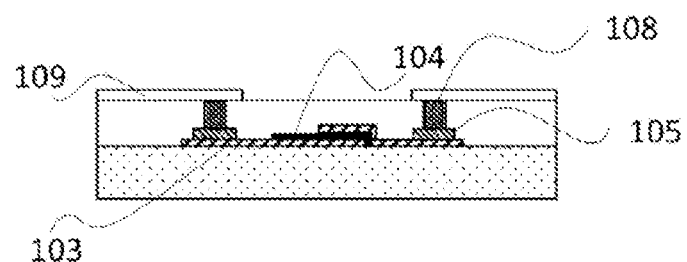
FIG. 9 is a cross-sectional view of one configuration of the thin-film MIM structure according to the second embodiment of the present invention.

In the MIM capacitor structure 106 of the present patent shown in FIGS. 5, 8, and 9, a capacitor structure is formed by laminating a thin-film first conductive film 103, a dielectric layer 104, and a thin-film second conductive film 105.

Figure 10:
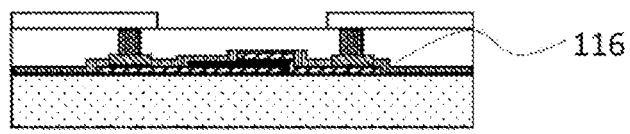
FIG. 10 is a cross-sectional view of one configuration of the thin-film MIM structure according to the second embodiment of the present invention.

In FIG. 10, a second dielectric layer 116 is formed after the second conductive film 105 is formed, if necessary.

The method for forming a thin film conductor, which is the lower electrode of FIG. 8, may include, for example, vacuum deposition, sputtering, ion plating, a molecular beam epitaxy (MBE) method, a laser ablation method, a CVD method, and the like, and a typical method may be used.

The conductor thicknesses of the first conductive film 103 and the second conductive film 105 shown in FIGS. 8 and 9 are preferably 10 nm or more and 1000 nm or less. A conductive film having a thickness of less than 10 nm may undesirably lead to a conduction failure in the subsequent copper electroplating step. When the thickness is 1000 nm or more, it takes an excessive amount of time to etch the target section to be removed in the pattern. More preferably, 20 nm or more and 200 nm or less is desirable.

The second conductive film may be thickened by plating for the purpose of protecting the bottom of the interlayer via 108. For example, after the seed layer 105a is formed, copper plating may be performed by a semi-additive method to increase the thickness of the second conductive film other than the MIM structure 106 to 2 µm or more and 12 µm or less.

In FIG. 10, the second dielectric layer 116 or the like is sputter deposited on the second conductive film 105 to provide a coating for insulating protection. The second dielectric layer 116 is provided to improve insulation reliability for the purpose of preventing migration, and may not be formed if sufficient insulation can be ensured. As the dielectric layer 104 of the MIM capacitor shown in FIGS. 8 to 10, for example, a thin-film layer of silicon nitride is used. In view of insulation properties, relative permittivity, and dielectric loss tangent, the dielectric layer 104 may be selected from alumina, silica, silicon nitride, tantalum oxide, titanium oxide, calcium titanate, barium titanate, and strontium titanate.

The dielectric layer 104 may preferably have a thickness of 10 nm or more and 1000 nm or less. It is difficult for a dielectric layer 104 with a thickness of 10 nm or less to maintain the insulation properties and such a dielectric layer may fail to function as a capacitor. To obtain the dielectric layer 104 with a thickness of 1 µm or more, an excessive amount of time is required for the thin film formation. Thus, the thickness of the dielectric is more preferably 10 nm or more and 200 nm or less.

A plating seed layer 109a is formed on the insulating resin layer 107 as a power supply layer for forming the third conductive layer 109 by a semi-additive method. The plating seed layer 109a may be any material having good adhesion to chromium and copper, for example. The third conductive layer 109 may be formed of, for example, copper, nickel, aluminum, titanium, chromium, molybdenum, tungsten, tantalum, gold, iridium, ruthenium, palladium, platinum, or a combination thereof. Copper is more preferred to facilitate etching removal later. The plating seed layer 109a for the third conductive layer desirably has a thickness of 10 nm or more and 5 μm or less. A plating seed layer 109a having a thickness of less than 10 nm may undesirably lead to a conduction failure in the interlayer via 108. When the thickness is 5 μm or more, it takes an excessive amount of time to etch the section to be removed in the patterning. More preferably, 100 nm or more and 500 nm or less is desirable.

Electrolytic plating is applied to the opening portion of the resist through the plating seed layer 109a with respect to the formation of the third conductive layer 109. Examples of the electrolytic plating include nickel electroplating, copper electroplating, chromium electroplating, palladium electroplating, and gold electroplating. However, material that requires simple steps, low cost, and has good electrical properties is preferred. The second conductive film 5 serving as an upper electrode of the capacitor is formed of a chromium thin film. A material having high electrical conductivity is preferred. Nickel, chromium, palladium, gold, or iridium may be used in addition to copper.

In FIG. 6R, a resist 115 for forming the third conductive layer is used to cover the periphery of the plating seed layer 109a and the third conductive layer 109, which will be the copper plating layer. Subsequently, as shown in FIG. 6S, the resist is removed, and as shown in FIG. 6T, the seed layer 109a laminated on the surface layer is removed. The removal method of the resist may be dry etching or the like in addition to a chemical method but is not limited.

The capacitor structure 106 shown in FIGS. 5, 8, 9, and 10 is obtained through the above steps.

The lower electrode, the dielectric, and the upper electrode of the capacitor structure 106 formed in the second embodiment use a resist pattern to form a shape by sputter deposition or etching. Note that the electrode shape and the dielectric shape may be any shape as long as the electrode area of the conductor and the dielectric volume calculated for obtaining the desired capacitance value are obtained. The shape of the electrode in the present embodiment is rectangular, but may have any shape such as a polygon or a circle.

In order to control the capacitance value, the electrode shape may be formed by crossing the upper electrode and the lower electrode, and the overlapping portion may be used as an MIM capacitor.

In forming the multilayer wiring substrate 118 of FIG. 5, the conductive layers and the insulating resin layers are alternately laminated. The insulating resin may be made of epoxy resins, polyimides, maleimides, polyethylene terephthalate, polyphenylene oxides, liquid crystal polymers, and a composite material thereof, and photosensitive polyimide resins, photosensitive polybenzoxazole, and photosensitive acrylic-epoxy resins. The method of forming the insulating resin layers 107 and 107b is not limited. For a sheet-like material, a vacuum lamination method, vacuum pressing, or a roll lamination method may be used.

When the insulating resin layers 107 are made of liquid material, the forming method may be selected from slit coating, curtain coating, die coating, spray coating electrostatic coating, inkjet coating, gravure coating, screen printing, gravure offset printing, spin coating, and doctor coating. Additionally, when forming an outermost layer, a solder resist may be used.

In forming the interlayer vias 108 to be formed in the insulating resin layer 107, when a non-photosensitive resin is used, a via hole can be formed by laser processing. Examples of the laser include a CO2 laser, an MV laser, a picosecond laser, and a femtosecond laser. When the insulating resin is formed of a photosensitive material, the via holes can be formed using photolithography. The method is not limited as long as openings are formed in the insulating resin uniformly, and the via holes that electrically connect the conductor layer of the lower layer and the conductor layer of the upper layer are formed.

After forming the openings, desmearing is performed using a permanganic acid solution as appropriate, so that the resin surface is roughened and the inside of the via holes is cleaned. This improves the adhesion at the boundary surfaces of the copper plating layer and the insulating resin layer. For adhesion and washing of the inside of the holes, plasma treatment may be used.

The interlayer via 108 is an interlayer connection portion for electrically connecting a conductive wire or a pad formed on the second conductive film 105 and the third conductive layer 109. In the present embodiment, copper plating is selected, but if the interlayer connection is electrically maintained, the shape and the material to be filled are not limited.

The plating layers of the insulating resin layer 107, the interlayer via 108, and the third conductive layer 109 may be formed repeatedly using a known technique to form the multilayer wiring board 118 having an arbitrary number of layers.

In a step of forming the first conductive film 103 on the core substrate 101 to form a wiring pattern, an inductor constituting an LC resonance circuit is formed. The inductor may be made by alternately connecting the upper and lower layers of the core substrate 101 in series with the wiring pattern including the through hole 102 in the core substrate 101 and the first conductive film 103 formed on the front and rear of the core substrate 101. Further, the inductor may alternatively be made by forming a selected number of conductive wires in a planar spiral shape using patterning techniques on the first conductive films on the front and rear surfaces of the glass plate and connecting the conductive wires in series with each other using through hole 102 and interlayer vias 108. Regardless of the first conductive film, the third conductive layer, or the fourth conductive layer, the inductor may be an inductor in which a solenoid type or a spiral type is three-dimensionally formed in an arbitrary insulating resin layer and a conductor layer using an interlayer connection. As long as the LC circuit has a structure having an inductance value, this is not required. When the inductor and the capacitor constitute the LC resonant circuit, one end of the connection wiring of the inductor is located on the wiring pattern on the first conductive film 103 and is electrically connected to the capacitor by the wiring pattern on the first conductive film 103.

The inductance value of the inductance structure depends on the number of windings, the cross-sectional area, and the inductance length, but in the solenoid type coil, the value can be controlled by the thickness of the glass, spacing of windings, and the use of magnetic materials in the winding core.

To achieve the desired capacitance value with the capacitor MIM structure 106, two or more capacitor structures 106 may be connected in series or in parallel. For such connection, the conductive wire pattern formed on the second conductive film 105 or the conductive wire pattern formed on the third conductive layer 109 is used. When the inductor and the capacitor using the glass through hole constitute the LC resonant circuit, the lower electrode of the capacitor formed on the first conductive film 103 or the pattern on the second conductive film 105 is electrically connected to one end of the inductor formed on the first conductive film 103 with the wiring pattern formed on the first conductive film 103. The connection points of resonant sections of the connected LC resonators are bundled by interlayer vias and connected to the third conductive layer 109.

In the thin film capacitor of the second embodiment of the present invention, the area of the lower electrode and the area of the dielectric layer 104 are designed to be larger than the area of the second conductive film 105 which serves as the upper electrode, and the capacitance of the capacitor can be controlled by changing the dimension of the second conductive film 105 at the superposed portion.

In the second embodiment, the second conductive film 105 is formed in a rectangular strip shape and is superposed on the first conductive film and the dielectric layer. However, as long as the second conductive film 105 is formed directly on the substrate in a thin film conductor layer/dielectric layer/thin film conductor layer structure using a sputter deposition technique, the angle at which the first conductive film and the second conductive film are superposed, the shape and area of the electrodes do not matter.

In the second embodiment, the MIM structure 106 is formed of a thin film on the surface of the glass, but the type of conductors to be laminated on the front and rear surfaces of the glass, the film thickness and shape constituting the MIM, and the thickness and type of the dielectric may be individually set on the front and rear surfaces.

As described above, in the second embodiment of the present invention, by forming a thin-film capacitor directly on the glass, a circuit board having a small capacitor with a low height can be obtained. Further, the GND can be shielded by placing it on the third conductive layer directly above where the structure of the capacitor is formed, and thus a stable capacitance value at 10 GHz or below can be obtained.

Thus, an advantageous effect of improving the frequency selection characteristics is achieved, and a filter having high-frequency selectivity can be formed in the multilayer wiring substrate.

The conductive wire formed on the lower electrode of the thin-film capacitor can be formed at the same time as the lower electrode layer in the conducting the first conductive film directly on the glass. In the step of patterning the dielectric layer to form a conductive wire in the upper electrode conductive layer, a portion of the upper electrode is formed directly on the glass.

EXAMPLES

The results of three-dimensional electromagnetic field analysis using the above structure are shown. The electromagnetic analysis software HFSS manufactured by ANSYS, Inc. was used.

Example 1

Figure 13:
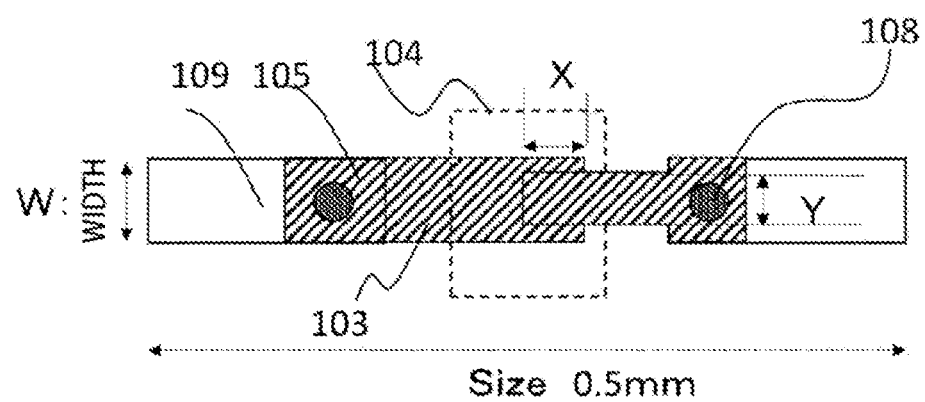
FIG. 13 is a diagram showing an example according to the second embodiment of the present invention.
Figure 14:
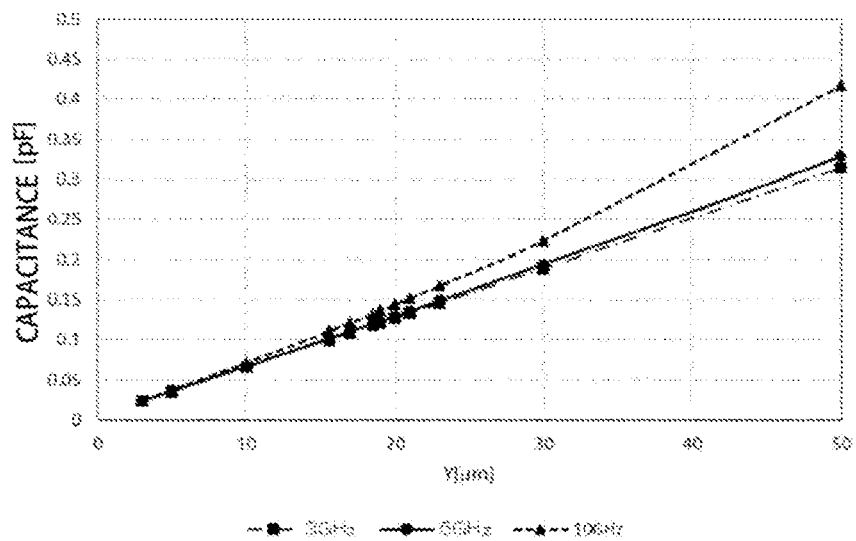
FIG. 14 is a diagram showing a result of Example 1 according to the second embodiment of the present invention.
Figure 15:
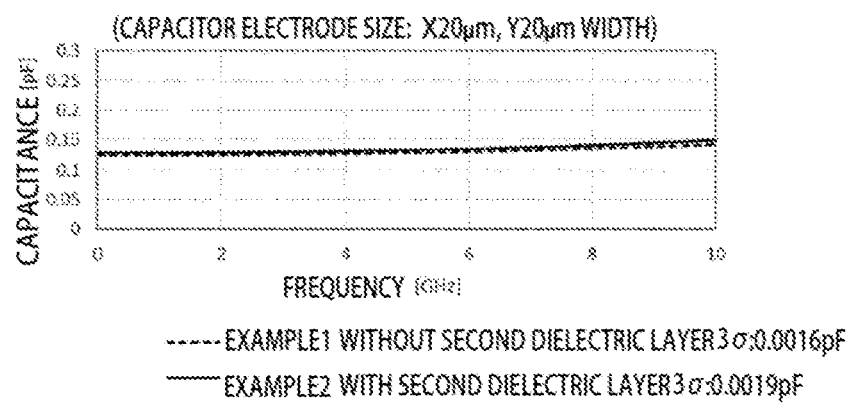
FIG. 15 is a diagram showing a result of Example 2 according to the second embodiment of the present invention.

As an evaluation method, in FIG. 13, the capacitance values of the capacitor when X was fixed at 20 μm and the dimension of Y was changed from 2 μm to 50 μm were analyzed. Capacitance values of a capacitor at frequencies of 3 GHz, 5 GHz, and 10 GHz at levels of 3, 5, 10, 15.57, 17, 18.5, 19, 20, 21, 23, 30, and 50 μm were plotted and the verification was conducted. In Example 1, the Y dimension was varied, but the desired capacitance value can be obtained by changing the X direction and changing the area of the superimposed portion of the upper and lower electrodes. By making the dimension of Y smaller than the dimension of W, the variation of the capacitance value due to positional errors of the first conductive film 103 and the second conductive film 105 in the Y direction is mitigated. The shape of the first conductive film 103 and the second conductive film 105, other than the superimposed area, is not limited to a rectangle and is arbitrary.

As detailed model conditions, the thickness of silicon nitride (relative permittivity 6.4 and dielectric loss tangent 0.0019) of the dielectric layer 104 is 200 nm, the thickness of chromium of the first conductive film 103 and the second conductive film 105 is 170 nm, the conductive wire width for extracting signals is 100 μm, and the conductive wire length for extracting input/output between layers is calculated to be approximately 500 μm. The wiring length can be designed to be as short as possible in the actual circuit, but this time it was set to 500 μm to provide terminals for measurement. A model was used in which the insulating resin layer 107 was approximately 20 μm thick (ABF Resin GX-T 31 Ajinomoto Fine-Techno Co., Inc.), the third conductive layer 109 was 7 μm thick, and a copper shield was provided at a position 60 μm above the capacitor.

As a result, it was found that by increasing the Y direction of the second conductive film, the capacitor capacitance was increased almost linearly and could be controlled.

Accordingly, at frequencies below 10 GHz, stable characteristics can be obtained as a capacitor.

Example 2

FIG. 10 is a model in which a second dielectric layer is provided for improving adhesion and insulation of the thin film MIM structure, and the second dielectric layer 116 is made of silicon nitride. In FIG. 10, the second dielectric layer 116 is formed to cover the thin-film MIM structure 106 except for the portion where the interlayer via 108 is disposed. Whether the presence or absence of the second dielectric layer 116 affected the capacitance of the capacitor was examined. The second dielectric layer 116 was confirmed to be 200 nm.

As a result, it was confirmed that even when 200 nm of silicon nitride was provided as the second dielectric layer 116, it could be used as in Example 1 with almost no change in capacitor capacitance.

Figure 7:
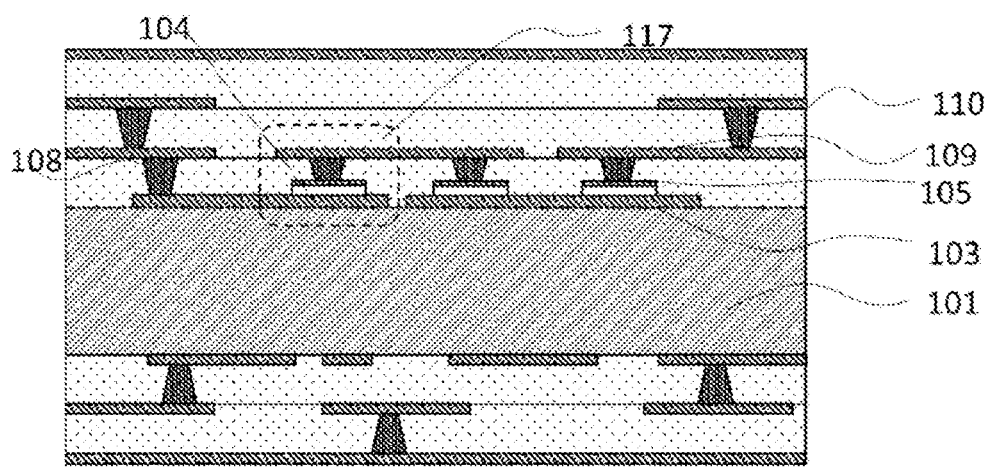
FIG. 7 is a cross-sectional view of a multilayer wiring substrate having a conventional MIM structure.
Figure 11:
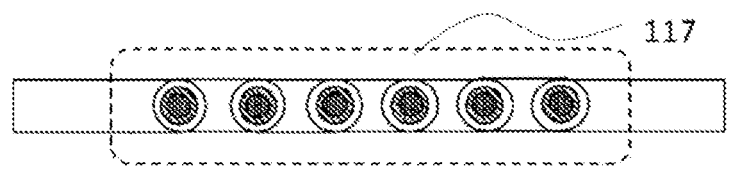
FIG. 11 is a top view of a series connection of a conventional MIM structure.
Figure 12:
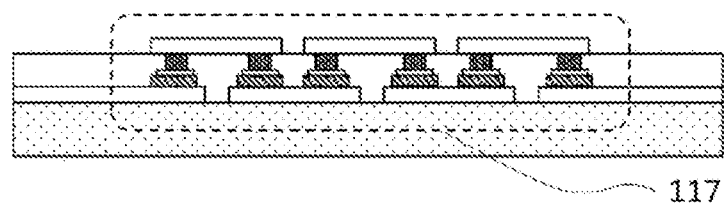
FIG. 12 is a cross-sectional view of the series connection of the conventional MIM structure.

FIG. 7 is a cross-sectional view of a multilayer wiring substrate having a conventional MIM structure 117. FIG. 11 is a top view of a series connection of a conventional MIM structure. FIG. 12 is a cross-sectional view of the series connection of the conventional MIM structure.

Figure 16:
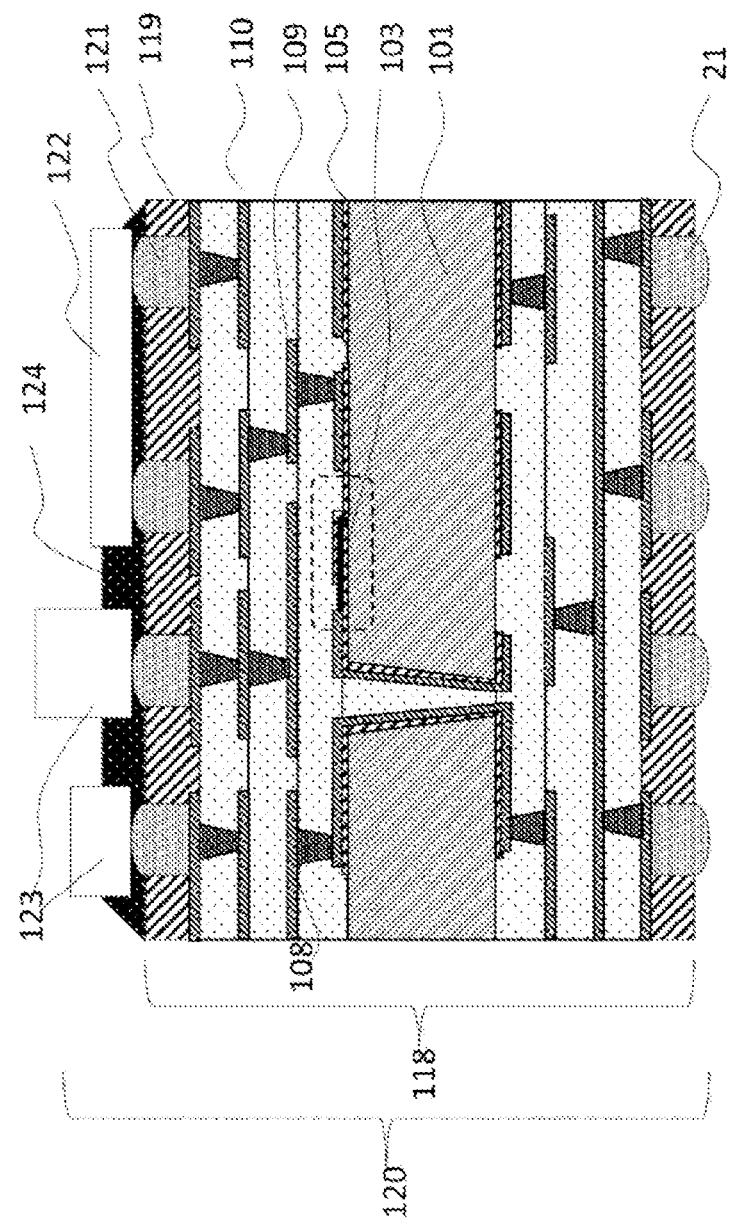
FIG. 16 is a cross-sectional view of a module having a multilayer wiring substrate according to the second embodiment of the present invention.
Figure 17:
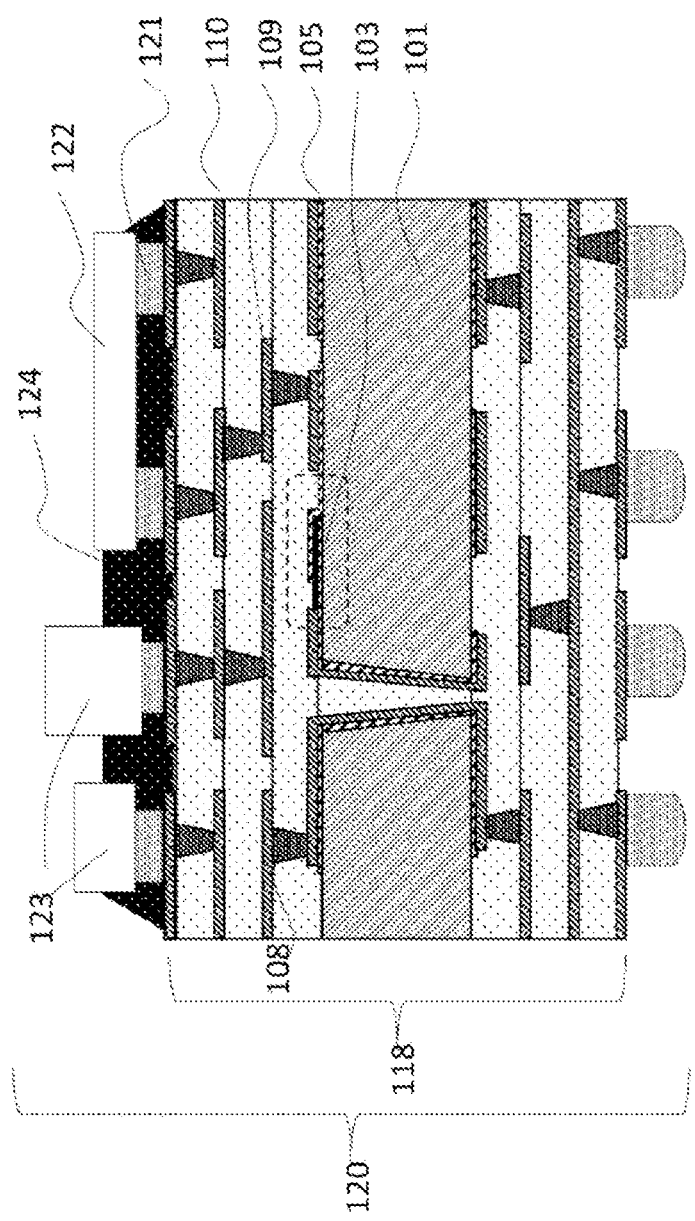
FIG. 17 is a cross-sectional view of the module having the multilayer wiring substrate according to the second embodiment of the present invention.

FIGS. 16 and 17 show a module having a multilayer wiring substrate according to the second embodiment of the present invention. Module 120 may have an outermost layer insulation resin 119, an external connection terminal 121, an active element 122, a passive element 123, and a sealing material 124.

Third Embodiment

A third embodiment of the present invention will now be described with reference to the drawings. The present invention is not limited to the third embodiment. In the description of the drawings, the same components are given the same reference signs.

Figure 18:
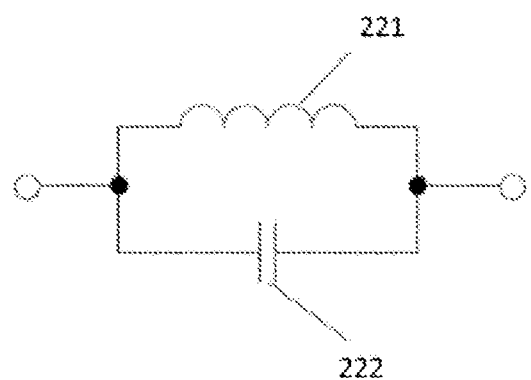
FIG. 18 is a diagram showing an example of an equivalent circuit of a resonance circuit according to a third embodiment of the present invention.

FIG. 18 shows an example of the minimum configuration of the equivalent circuit of the LC resonance circuit. As disclosed in PTL 1, an actual filter circuit is composed of a plurality of LC resonance circuits. The major capacitance value of the LC frequency filter used in the Sub 6 GHz band is estimated to be approximately 3.5 pF at 3.5 GHz and 2.5 pF at 5 GHz. However, for circuit optimization, it is preferable that smaller capacitor values can also be utilized.

FIGS. 19 to 30 schematically show the structure of the third embodiment, and show that the aforementioned capacitance value used in the Sub 6 GHz band can be easily realized. FIGS. 19 to 26 show the structure of the wiring on the glass core substrate, and FIGS. 27 to 30 show the structure of the resin laminated wiring formed on the core substrate wiring in the order of producing processes.

Figure 19:
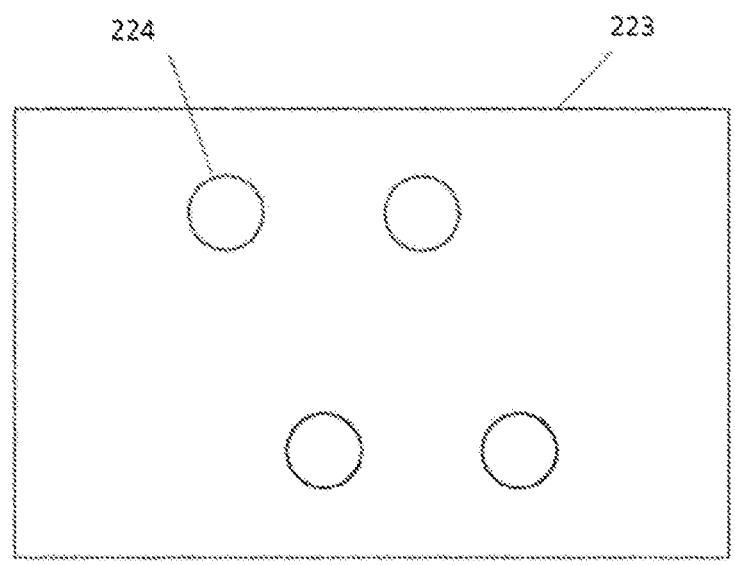
FIG. 19 is a diagram showing a glass substrate in which through holes are formed according to the third embodiment of the present invention.
Figure 20:
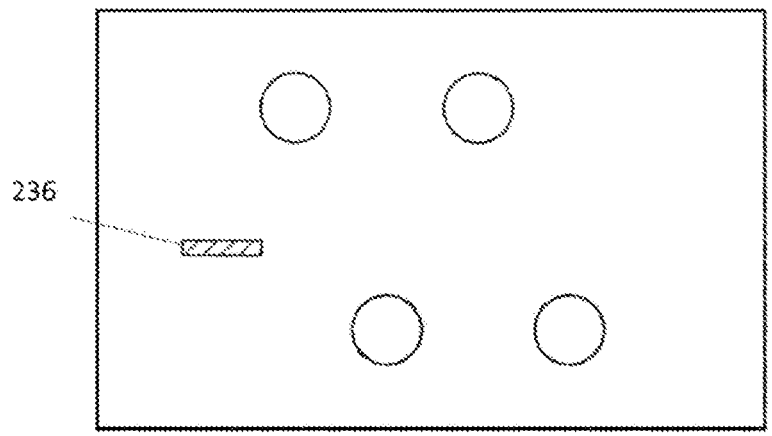
FIG. 20 is a diagram showing a first conductive wire using a capacitor structure according to the third embodiment of the present invention.

FIG. 19 shows a glass substrate provided with through holes, and FIG. 20 shows the structure of the first wiring. A film is formed by sputtering Cr to have a thickness of 0.2 μm and then shaped using photolithographic patterning techniques to produce a first conductive wire 236 with a portion serving as a lower electrode of the capacitor.

Figure 21:
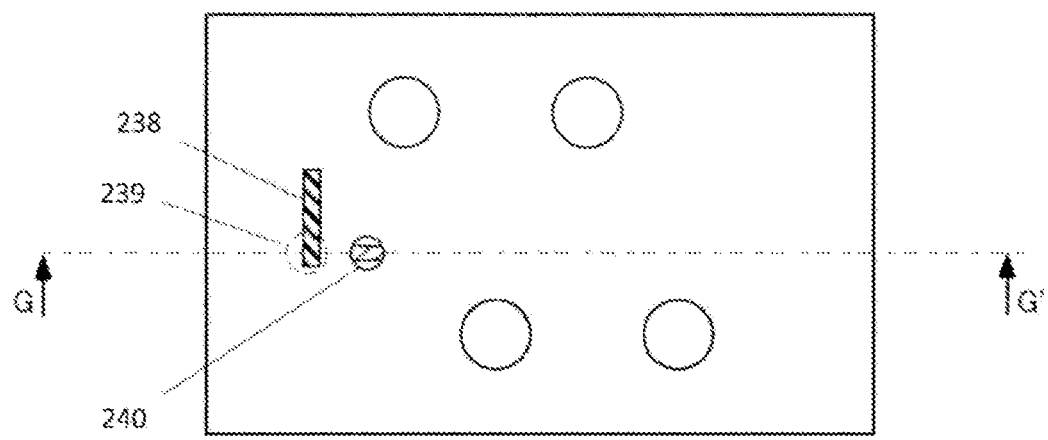
FIG. 21 is a diagram showing a second conductive wire using the capacitor structure according to the third embodiment of the present invention.
Figure 22:
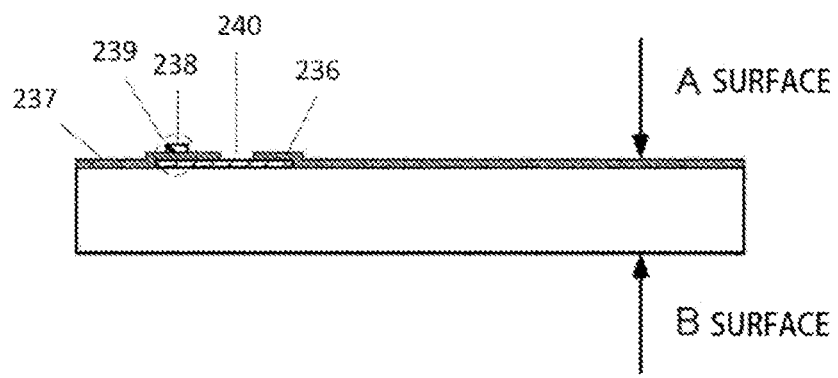
FIG. 22 is a cross-sectional view taken along the line G-G' of FIG. 21.

FIGS. 21 and 22 (G-G' cross section in FIG. 21) show the structure of the second wiring. A film is formed by depositing silicon nitride using CVD to have a thickness of 0.2 μm and shaped using photolithographic patterning techniques to produce a dielectric 237 with a portion serving as a dielectric of the capacitor. Subsequently, on the dielectric, a film is formed by sputtering Cr to have a thickness of 0.2 μm and then shaped using photolithographic patterning techniques to produce a second wiring 238 with a portion serving as an upper electrode of the capacitor, thereby completing a capacitor 239. The dielectric is also provided with a connection hole 240 to the lower electrode of the capacitor.

As shown in FIGS. 21 and 22, a dielectric having a film thickness of 0.2 μm formed by CVD can cover the first wiring having a film thickness of 0.2 μm including sidewalls, and thus the second conductive wire does not short-circuit at the intersection with the first conductive wire. A capacitor can be formed at the intersection of the first wiring and the second wiring through the dielectric. The width of the first conductive wire and the width of the second conductive wire are made constant, and the longitudinal directions of the first conductive wire and the second conductive wire are made different from each other. This leads to a mitigation of the variation of the capacitance value due to positional errors of the first conductive wire and the second conductive wire. The shapes of the first wiring and the second wiring other than the intersection of the two wirings, are not limited to rectangles and are arbitrary.

Figure 23:
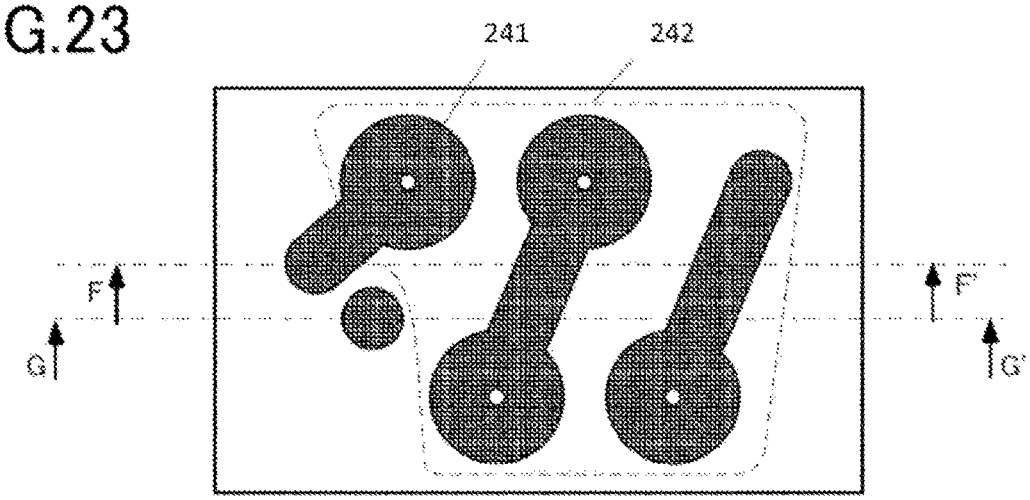
FIG. 23 is a diagram showing a third conductive wire of a substrate surface A using the capacitor structure according to the third embodiment of the present invention.
Figure 24:
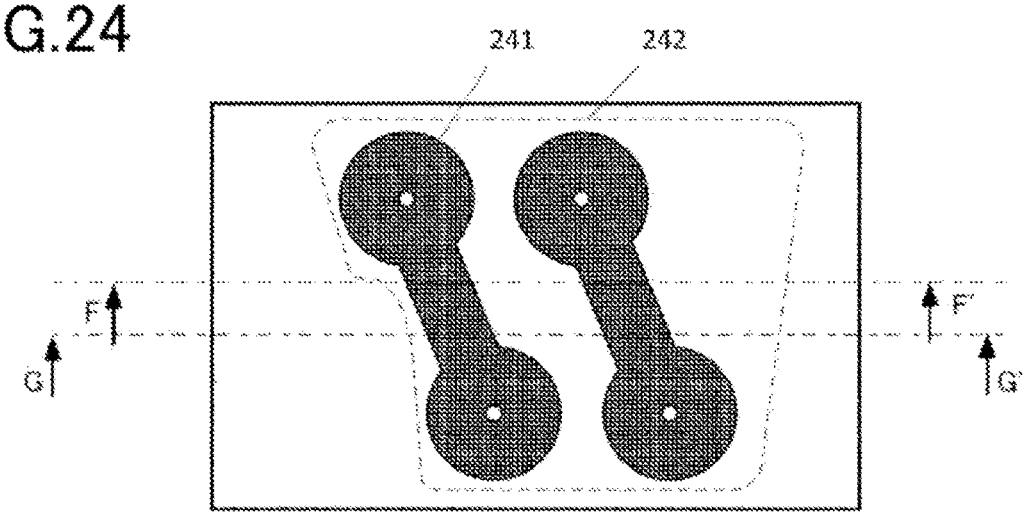
FIG. 24 is a diagram showing the third conductive wire of a substrate surface B using the capacitor structure according to the third embodiment of the present invention.
Figure 25:
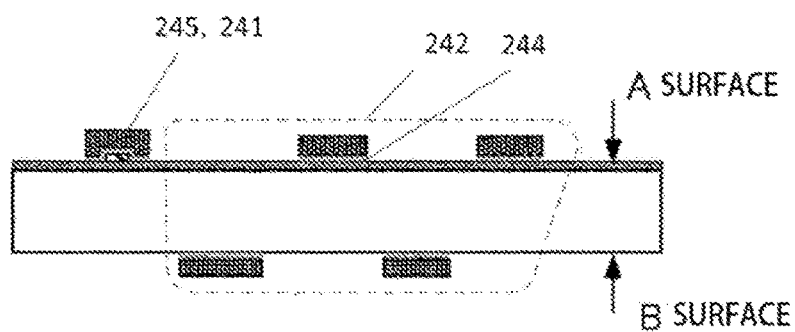
FIG. 25 is a cross-sectional view taken along the line F-F' of FIGS. 23 and 24.
Figure 26:
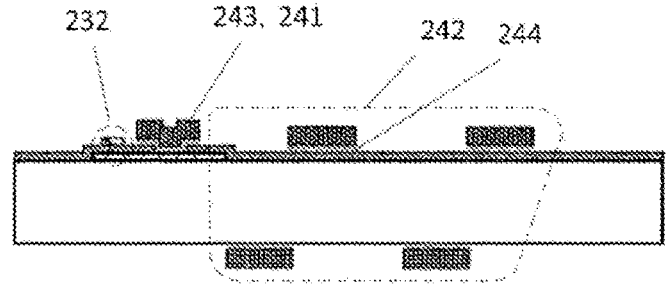
FIG. 26 is a cross-sectional view taken along the line G-G' of FIGS. 23 and 24.

FIG. 23 (a substrate surface A), FIG. 24 (a perspective view of a substrate surface B from the substrate surface A), FIG. 25 (a cross section taken along the line F-F' in FIGS. 23 and 24), and FIG. 26 (a cross section taken along the line G-G' in FIGS. 23 and 24) show the structure of the third conductive wire. On a plating seed layer 244, a Cu film is formed by additive electroplating (thickness: 15 μm), then a patterning is performed, and a third conductive wire 241 is formed by extending both surfaces of a glass substrate through a glass through-hole. An inductor 242 is completed by the third conductive wire, and at the same time, a Cu pad 243 connected to a part of the lower electrode of a capacitor and a Cu pad 245 connected to a part of the upper electrode of a capacitor are formed.

Figure 27:
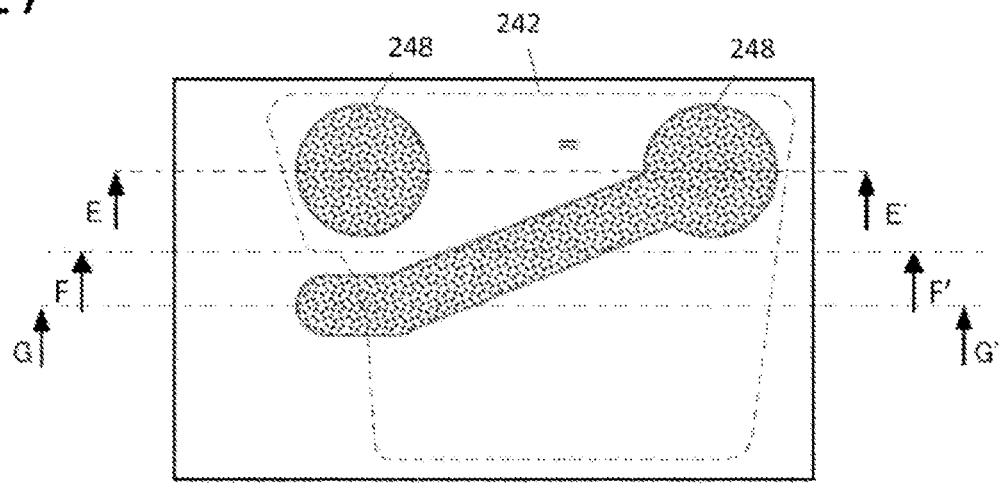
FIG. 27 is a diagram showing a fourth conductive wire using the capacitor structure according to the third embodiment of the present invention.
Figure 28:
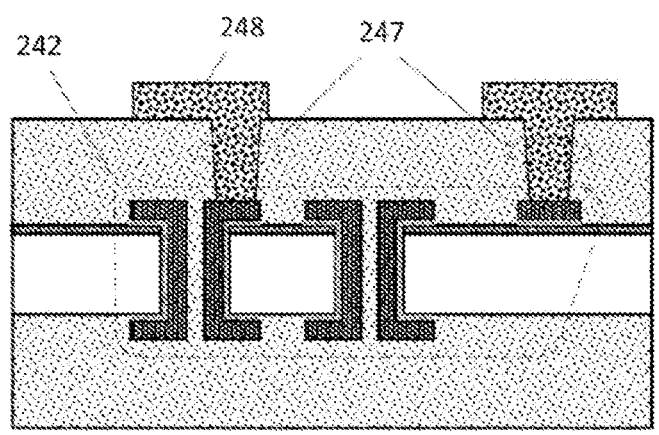
FIG. 28 is a cross-sectional view taken along the line E-E' of FIG. 27.
Figure 29:
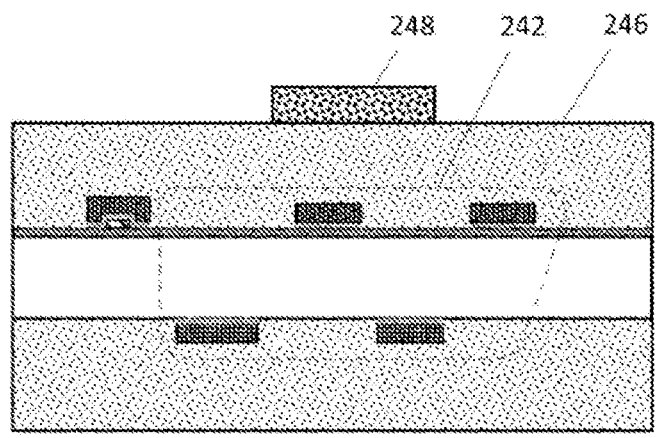
FIG. 29 is a cross-sectional view taken along the line F-F' of FIG. 27.
Figure 30:
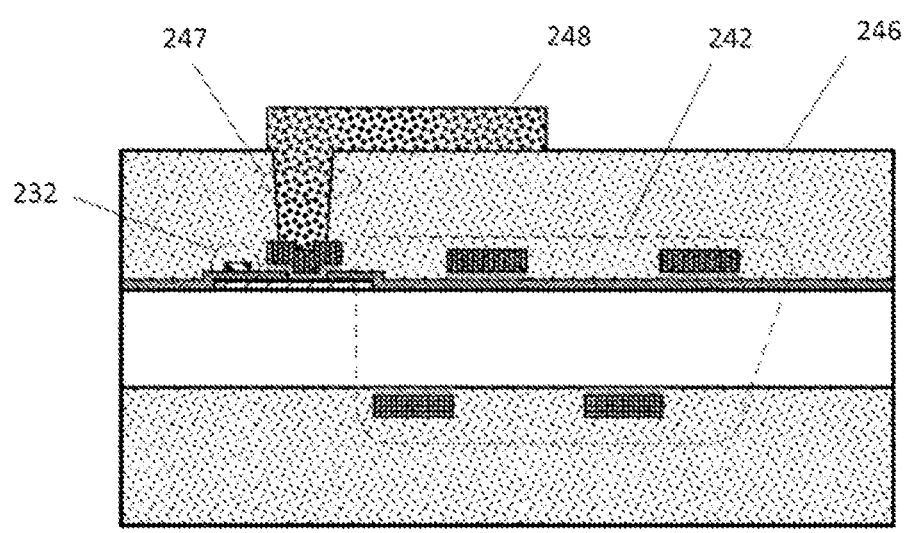
FIG. 30 is a cross-sectional view taken along the line G-G' of FIG. 27.

FIG. 27 (the substrate surface A), FIG. 28 (a cross section taken along the line E-E' in FIG. 27), FIG. 29 (a cross section taken along the line F-F' in FIG. 27), and FIG. 30 (a cross section taken along the line G-G' in FIG. 27) show the structure of the fourth wiring.

First, a resin film having a thickness of 25 μm is laminated on both surfaces of a glass substrate to form an insulating resin 246. Subsequently, an opening 247 is formed in the insulating resin by laser, and a Cu film is formed by additive electroplating (thickness: 15 μm), then a patterning is performed to form a fourth conductive wire 248. Then, the inductor and the capacitor are connected by the fourth conductive wire through the connection pad by the third conductive wire, and the LC resonator shown in FIG. 18 is completed.

In the structure of the third embodiment, the capacitance of the capacitor is determined by the area of the intersection of the first conductive wire and the second conductive wire through the dielectric, and the dielectric constant and the film thickness of the dielectric. For example, in the case of forming a Cr film having a thickness of 0.2 μm by photolithographic techniques to shape the minimum conductive wire width to 3 the area of the intersecting portion of the conductive wires is 9 μm2. Therefore, when silicon nitride with a dielectric constant of 7 F/m is used, the minimum capacitor capacitance is 0.023 pF. The 2.5 pF required for a 5 GHz frequency filter described above can be configured at the intersection of the first conductive wire and the second conductive wire having a width of 31 μm. Since the minimum wiring width is 3 μm, a smaller value required for an actual filter can be easily realized.

Although embodiments of the present invention have been described above, the present invention is not limited to the above-described embodiments, and various modifications may be made without departing from the scope of the present invention.

[Reference Signs List] 1 . . . Glass core; 2 . . . Glass through hole; 3 . . . First glass surface; 4 . . . Glass second surface; 5 . . . Inductor; 6 . . . Capacitor; 7 . . . Interlayer insulating layer; 8 . . . Interlayer via; 9 . . . Carrier glass (attached to the second surface); 10 . . . Carrier glass (attached to the second surface) adhesive layer; 11 . . . Conductive thin film of lower layer; 12 . . . Conductive thin film of upper layer; 13 . . . Dielectric thin film; 14 . . . Lower electrode of capacitor; 15 . . . Dielectric layer of capacitor; 16 . . . Upper electrode of capacitor; 17 . . . Resist for conductive thin film of lower layer; 18 . . . Resist for dielectric layer; 19 . . . Resist for conductive thin film of upper layer; 20 . . . Conductive wire on first surface of glass; 21 . . . Resist for protecting MIM capacitor; 22 . . . Glass through electrode; 23 . . . Glass carrier (attached to the first surface); 24 . . . Glass carrier (attached to the first surface) adhesive layer; 25 . . . Conductive wire directly on glass second surface; 26 . . . Conductive seed layer on second surface of glass core; 27 . . . Resist for conductive wire on second surface of glass core; 28 . . . Through hole in insulating layer; 29 . . . Terminal from upper electrode of thin-film MIM capacitor; 30 . . . Wiring on build-up layer; 31 . . . Conductive seed layer on interlayer insulating layer; 32 . . . Resist for wiring on build-up layer; 33 . . . Through electrode in interlayer dielectric layer; 101 . . . Core substrate; 102 . . . Through hole; 103 . . . First conductive film; 104 . . . First dielectric layer; 105 . . . Second conductive film; 105*a* . . . Plating seed layer for second conductive film; 105*b* . . . Plating layer for second conductive film; 106 . . . MIM structure; 107 . . . Insulating resin layer; 107*b* . . . Second insulating resin layer; 108 . . . Interlayer via; 109 . . . Third conductive layer; 109*a* . . . Plating seed layer for third conductive layer; 110 . . . Fourth conductive layer; 111 . . . Resist (for first conductive film); 112 . . . Resist (for dielectric); 113 . . . Resist (for second conductive film); 114 . . . Resist (for forming a thick-film portion of second conductive film); 115 . . . Resist (for forming third conductive film); 116 . . . Second dielectric layer; 117 . . . Conventional series MIM structure; 118 . . . Multilayer wiring substrate; 119 . . . Outermost layer insulation resin; 120 . . . Module; 121 . . . External connection terminal; 122 . . . Active element; 123 . . . Passive element; 124 . . . Sealing material; 221 . . . Inductor; 222 . . . Capacitor; 223 . . . Glass substrate; 224 . . . Glass through hole; 236 . . . First wiring; 237 . . . Dielectric; 238 . . . Second wiring; 239 . . . Capacitor; 240 . . . Connection hole to lower electrode of capacitor; 241 . . . Third wiring; 242 . . . Inductor; 243 . . . Cu pad connected to lower electrode of capacitor; 244 . . . Plating seed layer for third conductive wire; 245 . . . Cu pad connected to upper electrode of capacitor; 246 . . . Insulating resin; 247 . . . Insulating resin opening portion; 248 . . . Fourth wiring.

What is claimed is:

1. A multilayer wiring substrate comprising: a core substrate, and capacitors installed therein, comprising:
    a first capacitor that is at least one of the capacitors, the first capacitor including a lower electrode, a dielectric layer, and an upper electrode, the lower electrode being located closer to the core substrate than the dielectric layer and the upper electrode are, the upper electrode being located farther away from the core substrate than the dielectric layer and the lower electrode are,
    the lower electrode is entirely disposed on the core substrate,
    the upper electrode has a first portion and a second portion, the first portion overlapping the dielectric layer and the lower electrode to serve as the first capacitor, the second portion extending from the first portion, the second portion being disposed on a surface of the core substrate on which the lower electrode is arranged,
    the second portion of the upper electrode includes a terminal;
    an interlayer via is formed in an insulating resin layer formed on the upper electrode as a portion for electrically connecting adjacent conductor layers; and
    the interlayer via is formed on the upper electrode, the interlayer via connects the second portion of the upper electrode to a third conductive layer formed on the insulating resin layer.

2. The multilayer wiring substrate of claim 1, wherein the core substrate is made of glass.

3. The multilayer wiring substrate of claim 1, wherein the lower electrode has a thickness of 10 nm or more and 1000 nm or less.

4. The multilayer wiring substrate of claim 3, wherein the dielectric layer has a thickness of 10 nm or more and 1000 nm or less.

5. The multilayer wiring substrate of claim 1, wherein
    the lower electrode has a first constant width section which has a constant width,
    the upper electrode has a first constant width section which has a constant width, the constant width of the upper electrode being different from that of the constant width of the lower electrode, and
    the first constant width sections of the lower electrode and the upper electrode are arranged to overlap each other to serve as the first capacitor.

6. The multilayer wiring substrate of claim 1, wherein
    the lower electrode has a first constant width section which has a constant width and extends in a first direction,
    the upper electrode has a first constant width section which has a constant width and extends in a second direction different from the first direction, and
    the first constant width sections of the lower electrode and the upper electrode are arranged to overlap each other to serve as the first capacitor.

7. The multilayer wiring substrate of claim 1, comprising: inductors installed in the multilayer wiring substrate; and
    a first inductor that is at least one of the inductors, the first inductor including a first conductive wire, a second conductive wire, and an electrode, the first conductive wire being disposed on a first surface of the core substrate, the second conductive wire being disposed on a second surface of the core substrate which is opposed to the first surface, the electrode extending through a thickness of the core substrate, the first conductive wire, the second conductive wire, and the electrode being connected together in a form of a solenoid.

8. A module comprising:
    the multilayer wiring substrate of claim 1; and
    a passive component or an active component which is mounted on the multilayer wiring substrate.

\* \* \* \* \*